(12) United States Patent
Peña

(10) Patent No.: US 6,907,637 B1
(45) Date of Patent: Jun. 21, 2005

(54) EDGE WHEEL ASSEMBLY IN A SUBSTRATE PROCESSING BRUSH BOX

(75) Inventor: Christopher J. Peña, Hayward, CA (US)

(73) Assignee: Lam Research Corporation, Fremont, CA (US)

( * ) Notice: Subject to any disclaimer, the term of this patent is extended or adjusted under 35 U.S.C. 154(b) by 235 days.

(21) Appl. No.: 10/184,714

(22) Filed: Jun. 27, 2002

Related U.S. Application Data

(60) Provisional application No. 60/301,986, filed on Jun. 29, 2001.

(51) Int. Cl.[7] .............................................. A46B 13/04
(52) U.S. Cl. ............................. 15/77; 15/88.2; 15/88.3; 15/97.1; 134/1
(58) Field of Search ......................... 15/77, 88.3, 102, 15/97.1; 134/6, 1

(56) References Cited

U.S. PATENT DOCUMENTS

| | | | | |
|---|---|---|---|---|
| 5,729,856 A | * | 3/1998 | Jang et al. ................... | 15/88.1 |
| 6,012,192 A | * | 1/2000 | Sawada et al. ................. | 15/77 |
| 6,070,284 A | * | 6/2000 | Garcia et al. .................. | 15/102 |
| 6,186,873 B1 | * | 2/2001 | Becker et al. ................. | 451/54 |
| 6,254,688 B1 | * | 7/2001 | Kobayashi et al. ............ | 134/1 |
| 6,427,566 B1 | * | 8/2002 | Jones et al. ................... | 82/101 |

* cited by examiner

*Primary Examiner*—Robert J. Warden, Sr.
*Assistant Examiner*—S Balsis
(74) *Attorney, Agent, or Firm*—Martine Penilla & Gencarella, LLP

(57) ABSTRACT

An edge wheel assembly for use in a semiconductor wafer fabrication brush box is provided. The edge wheel assembly is configured to support and to rotate a semiconductor wafer in a vertical orientation and includes an edge wheel assembly block having at least two pairs of edge wheel shaft bores. Edge wheels are attached to shafts extending through the edge wheel shaft bores, and a drive motor drives the shafts to rotate the edge wheels. The drive motor is coupled to the edge wheel assembly block with a plate which is designed to enable insertion of the edge wheel assembly into either one of a first side and a second side of the brush box. Component parts are designed to be configurable to a plurality of orientations and implementations.

17 Claims, 25 Drawing Sheets

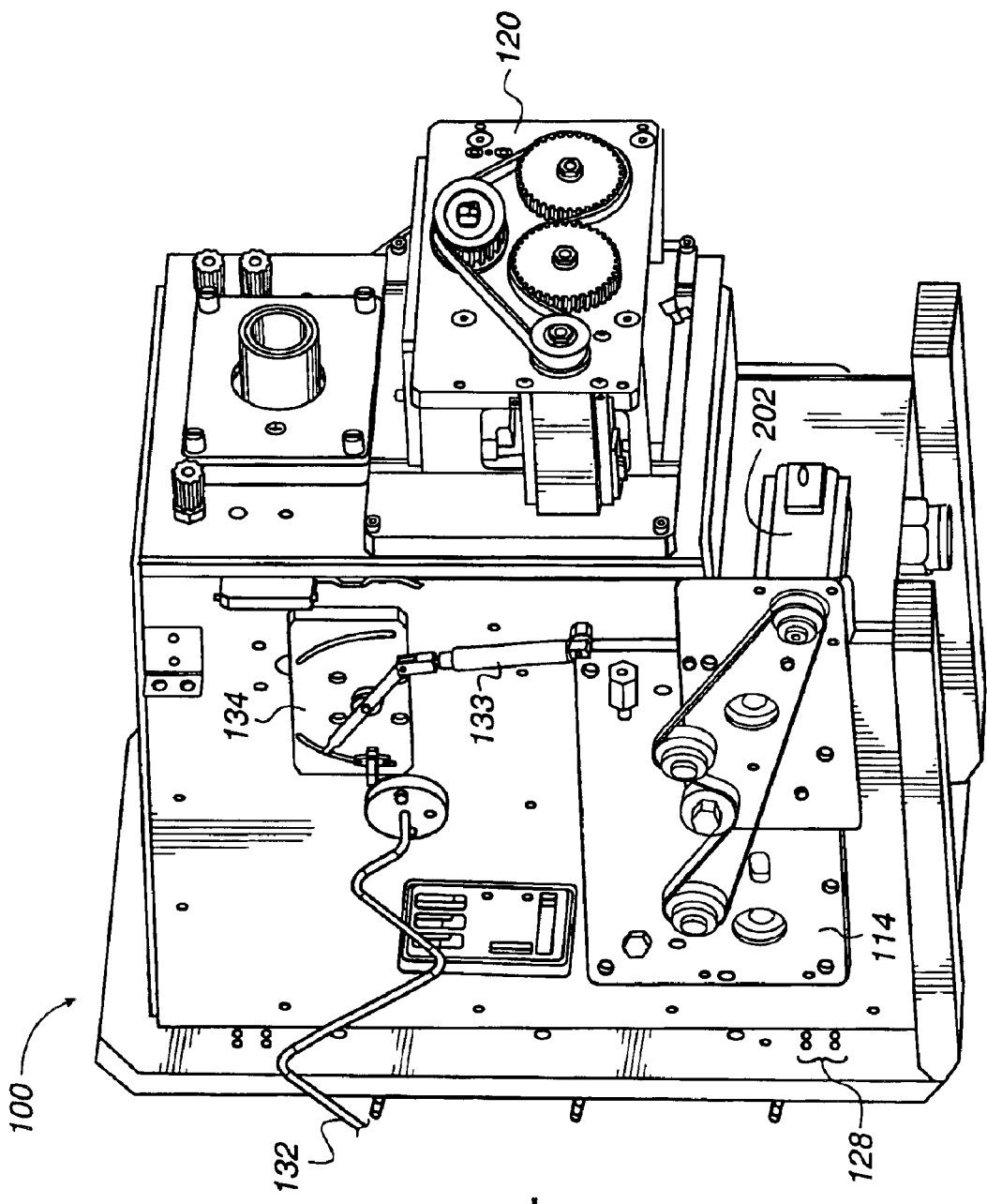

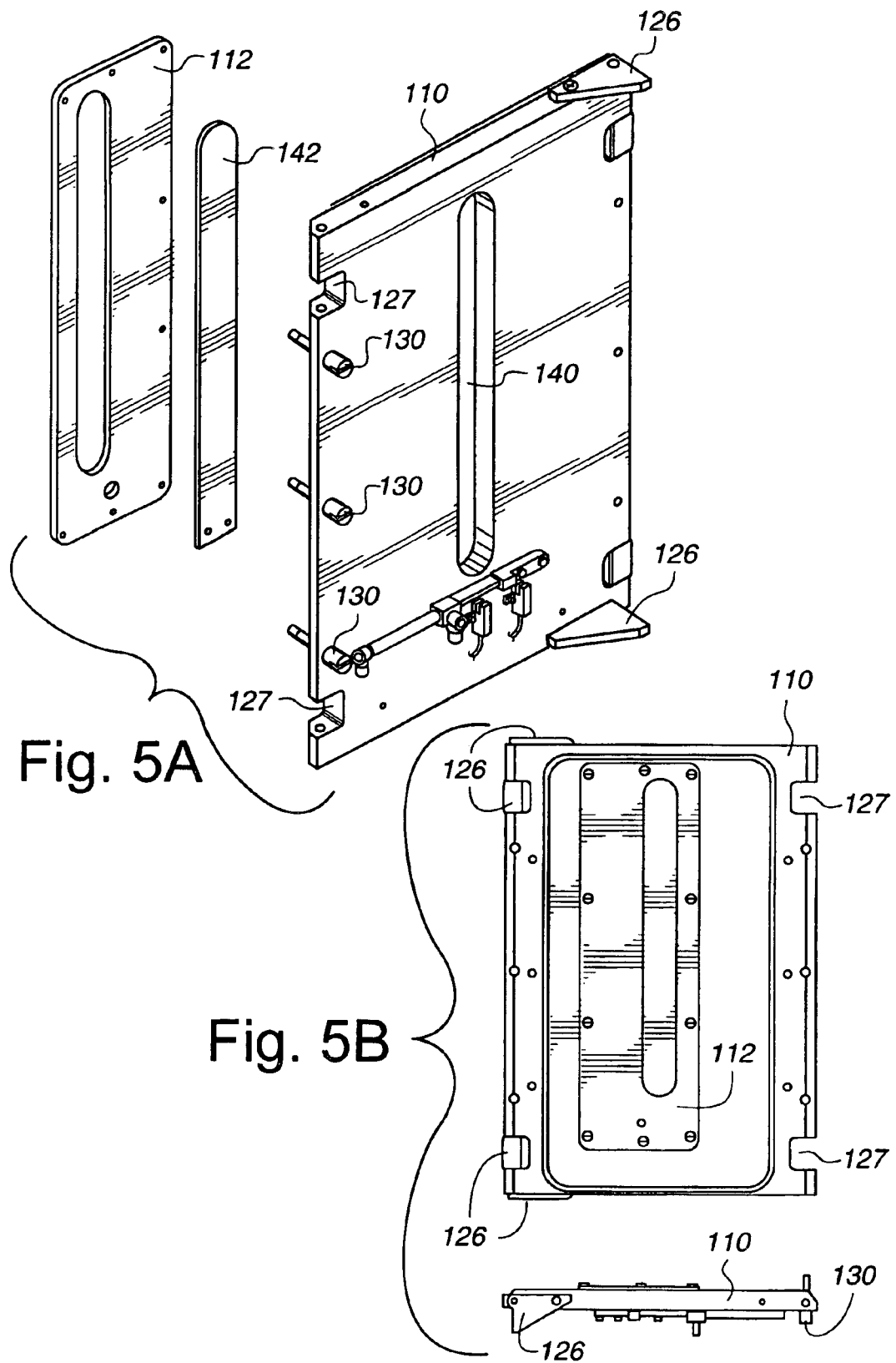

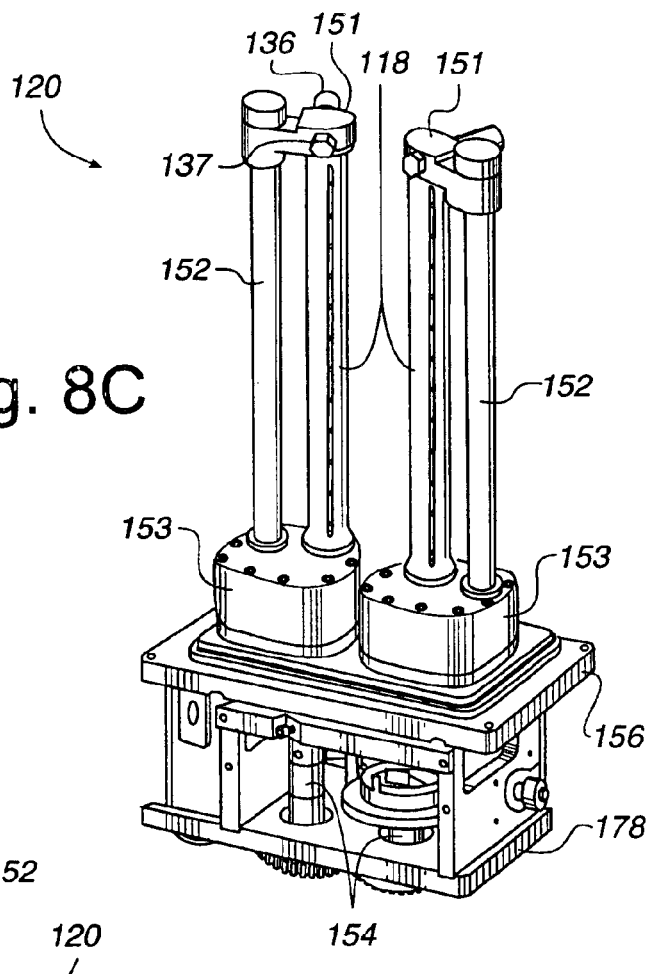
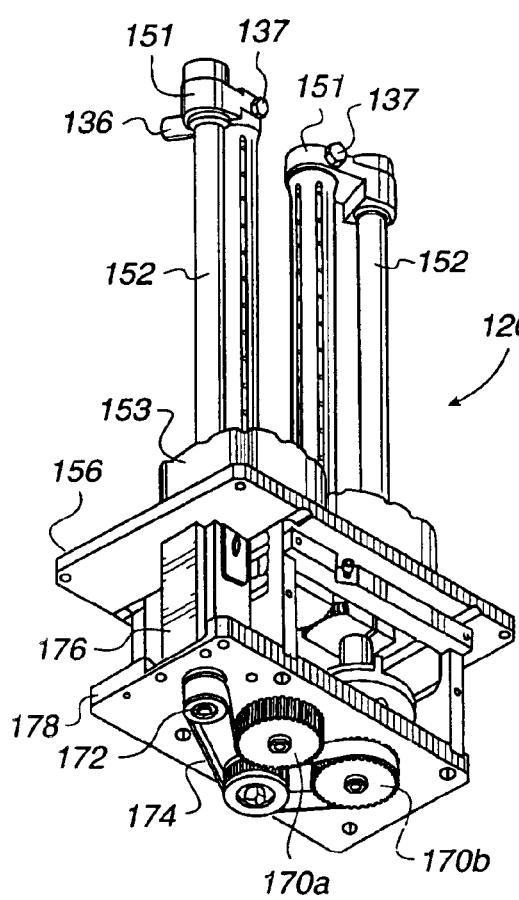
Fig. 8C
Fig. 8D

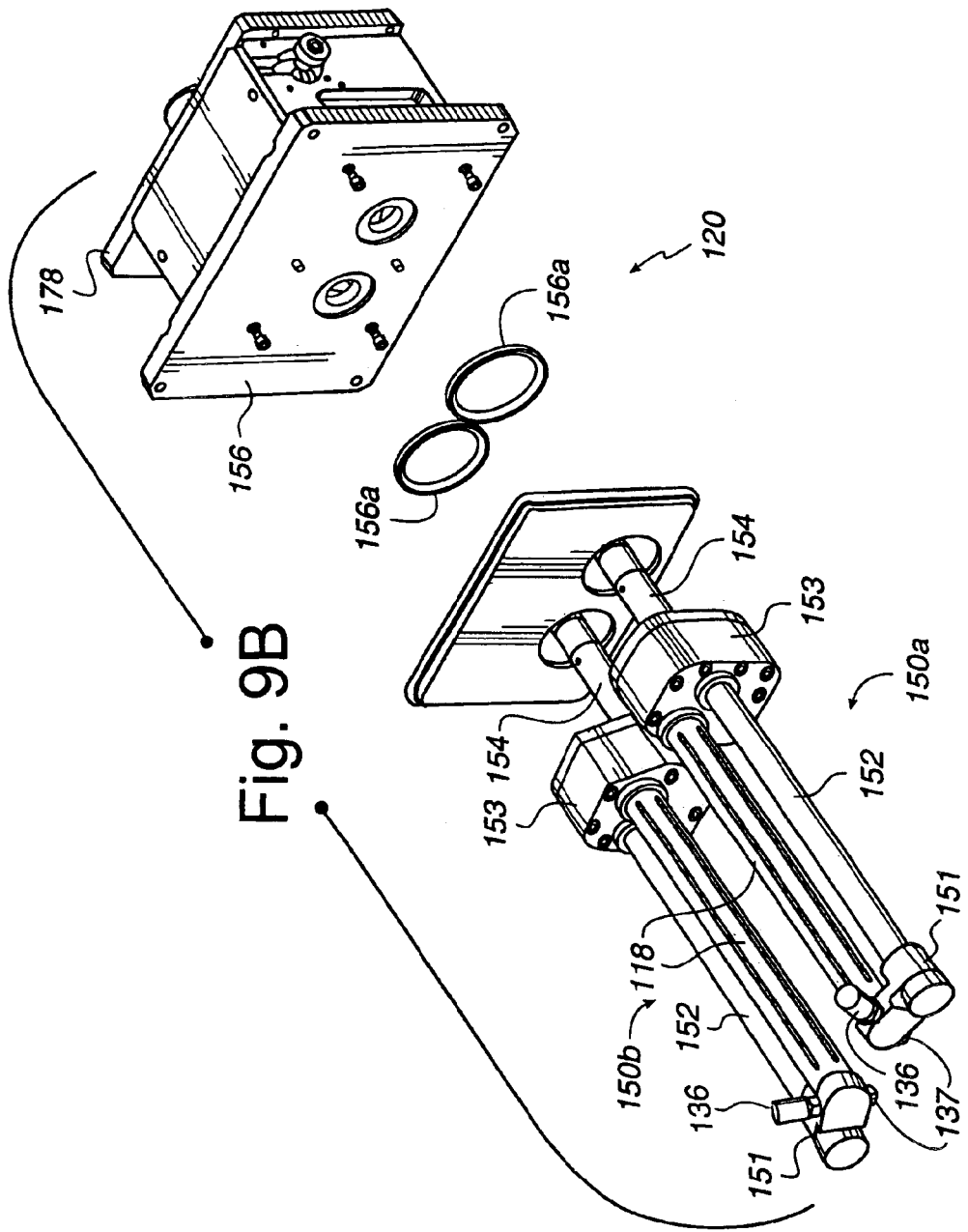

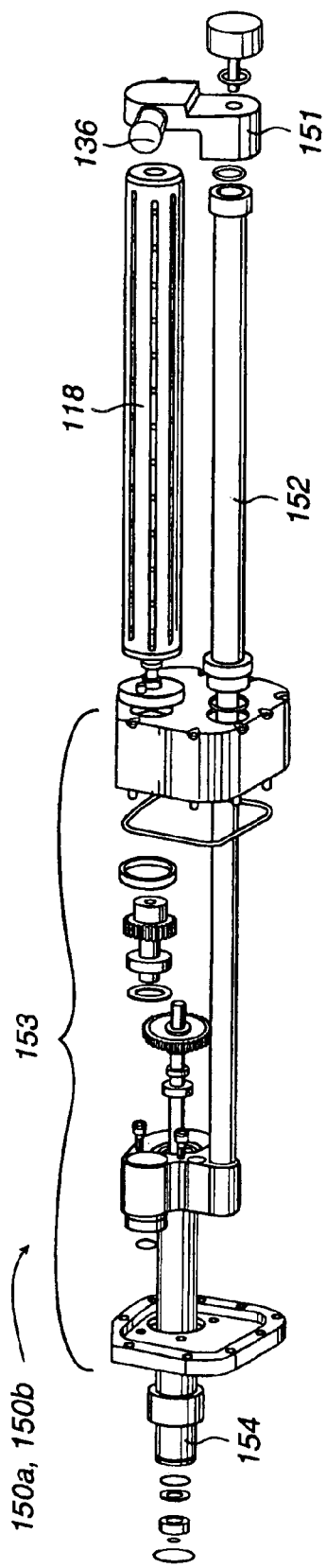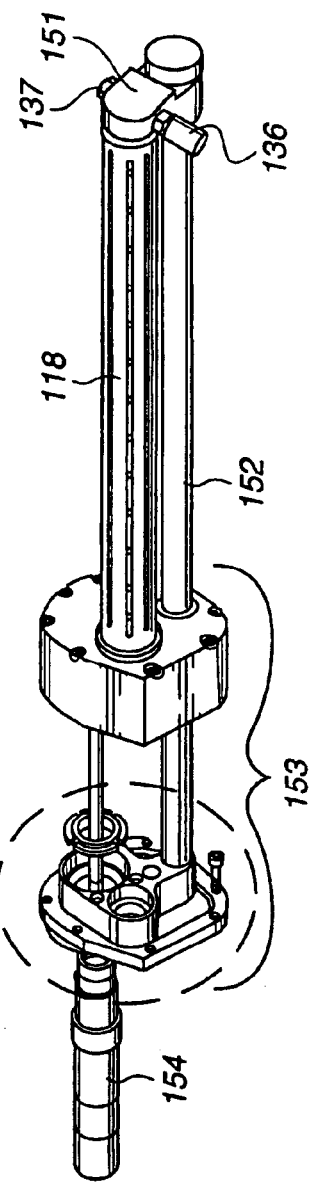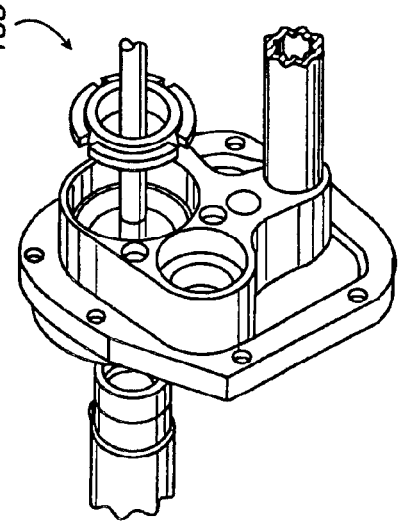

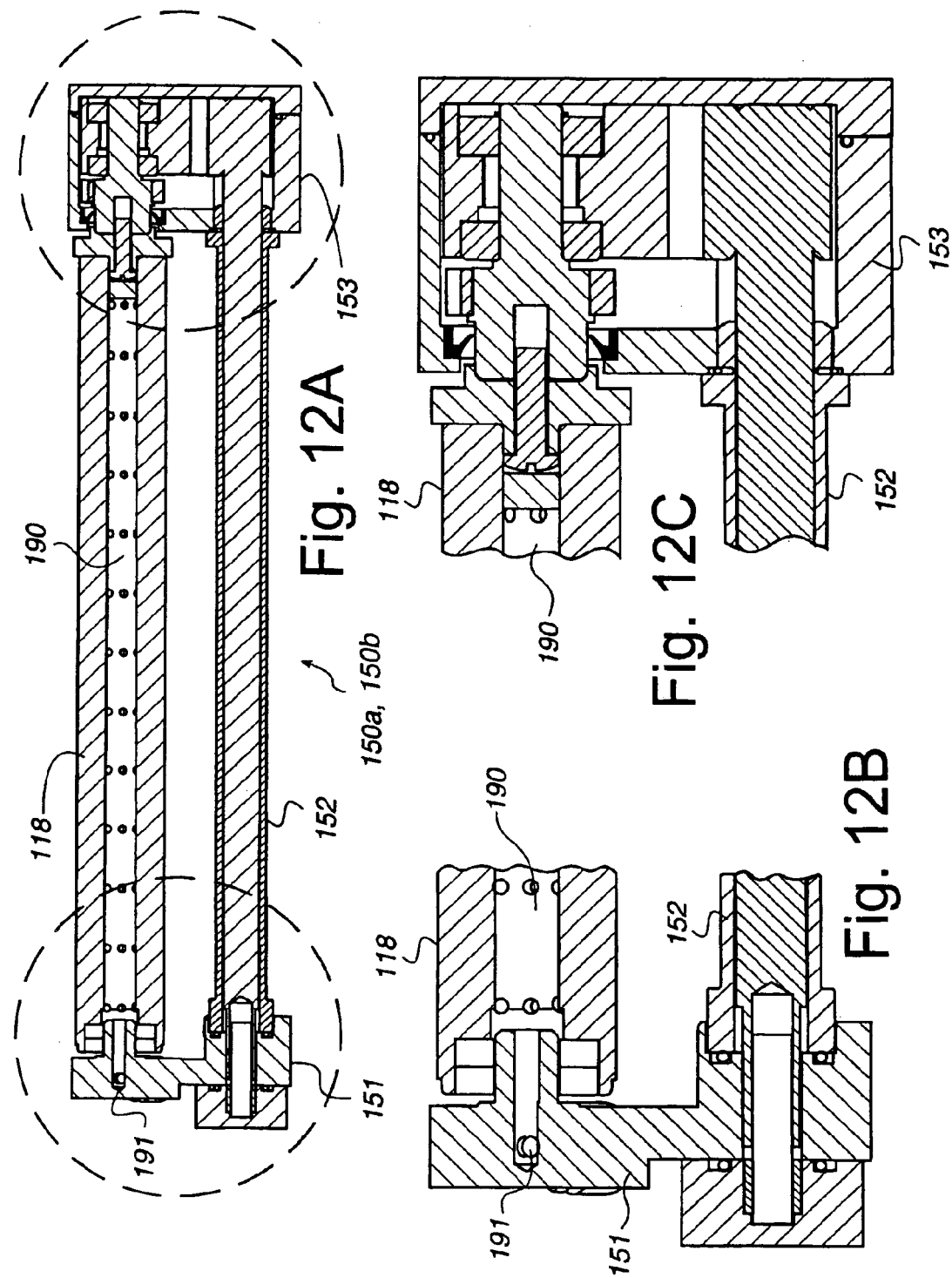

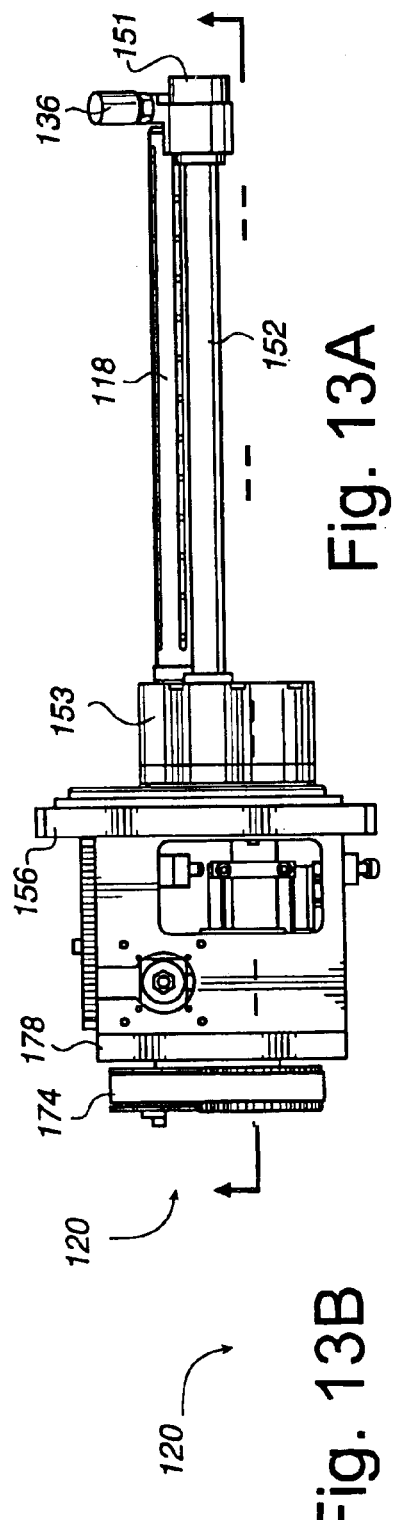
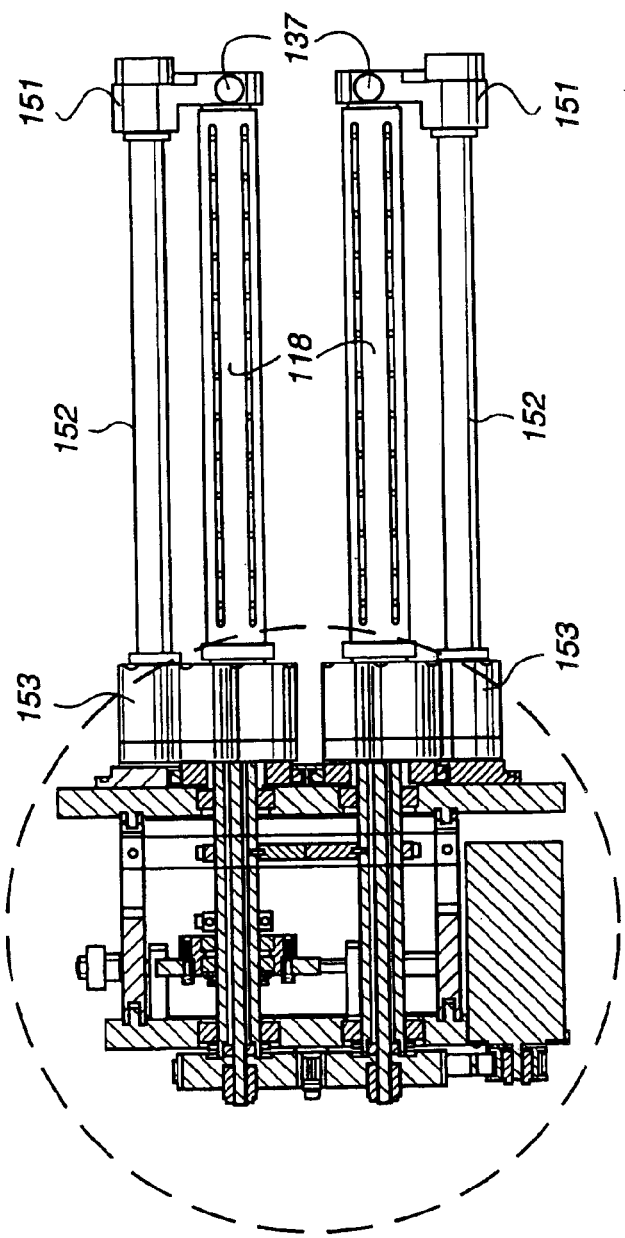
Fig. 13A
Fig. 13B

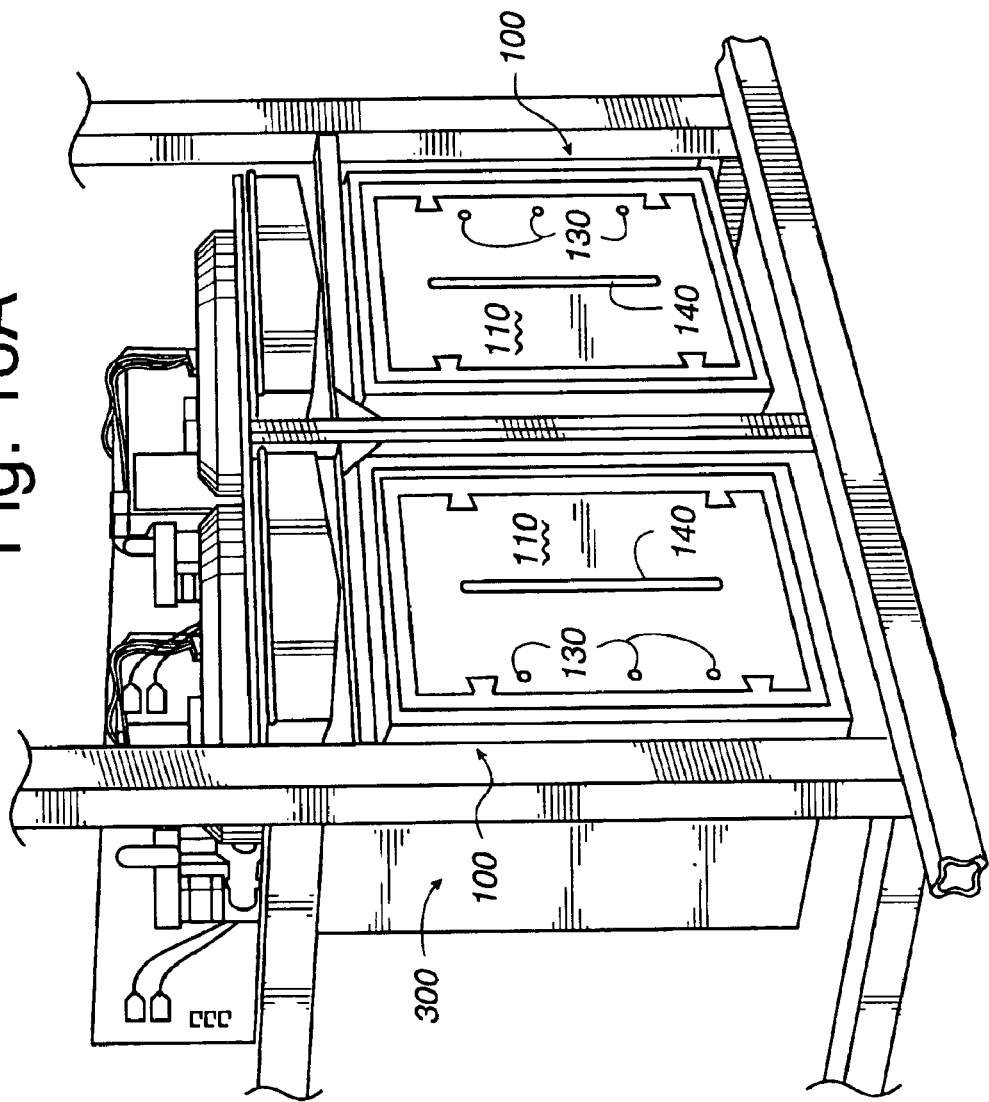

EDGE WHEEL ASSEMBLY IN A SUBSTRATE PROCESSING BRUSH BOX

CROSS REFERENCE TO RELATED APPLICATION

This application claims priority from U.S. Provisional Patent Application No. 60/301,986, filed Jun. 29, 2001, and entitled "SUBSTRATE PROCESSING BRUSH BOX." The disclosure of the provisional application is incorporated herein by reference.

BACKGROUND OF THE INVENTION

1. Field of the Invention

The present invention relates generally to substrate and semiconductor wafer preparation systems and methods, and more particularly, the present invention relates to the cleaning of substrates and semiconductor wafers using an inventive brush box and employing space, process, and manufacturing efficient systems.

2. Description of the Related Art

In the fabrication of semiconductor devices, there is a need to perform wet cleaning of substrates at various stages of the fabrication process. Typically, integrated circuit devices are in the form of multi-level structures. At the substrate level, transistor devices having diffusion regions are formed over and into silicon substrates. In subsequent levels, interconnect metallization lines are patterned and electrically connected to the transistor devices to define the desired functional device. As is well known, patterned conductive layers are insulated from other conductive layers by dielectric materials, such as silicon dioxide. At each metallization level there is a need to planarize metal or associated dielectric material. Without planarization, fabrication of additional metallization layers becomes substantially more difficult due to the higher variations in the surface topography. In some applications, metallization line patterns are formed in the dielectric material, and then metal CMP operations are performed to remove excess metallization.

Following each CMP operation, a wet clean of the substrate is performed. The wet clean is designed to wash away any by-products of the fabrication process, remove contaminants, and to achieve and maintain the necessary degree of cleanliness essential to proceed to a subsequent fabrication operation. As transistor device structures become smaller and more complex, the precision required to achieve and maintain structure definition demands exacting standards of cleanliness be maintained in all process operations. If a wet clean is incomplete or ineffective, or if a post-wet clean drying is incomplete or ineffective, then unacceptable residue or contaminants are introduced into the processing environment.

Similarly, in the fabrication of hard disk drives, planarization and cleaning operations are needed to maintain a clean and smooth disk substrate. Residue or contaminants remaining on substrates in the fabrication of hard disks and other devices utilizing similar substrates is likewise unacceptable.

Substrate cleaning and scrubbing techniques, methods, and apparatus are plentiful and known in the art, and incorporate such operations as rinsing and scrubbing, immersion, and the application of thermal, mechanical, chemical, electrical, and/or sonic energy and the like to remove or displace water to dry the substrate. One known cleaning and scrubbing technique implements brush stations in which polyvinyl alcohol (PVA) brushes are used to scrub both sides of a substrate. In a typical brush station process, a substrate is rotated in a vertical orientation by substrate drive rollers, also called substrate edge wheels. As the substrate is rotated, a pair of cylindrical brushes or pads is brought into contact with the opposing surfaces of the wafer. The brushes or pads are mounted on counter-rotating mandrels disposed on opposite sides of the wafer being processed. The mandrels span the diameter of the substrate across the substrate center. The rotation of the mandrels rotates the cylindrical brushes or pads which are then applied against the opposing surfaces of the rotating substrate. During the scrubbing operation in some systems, nozzles direct sprays of liquid, e.g., an abrasive slurry, a chemical solution, or a rinse solution, on the opposing surfaces of the wafer. In some applications, liquid for polishing, scrubbing, or cleaning is supplied through the brush or pad, and some systems employ a combination of nozzles and fluid delivery through the brush or pad.

Substrate fabrication equipment is typically configured in integrated systems to maximize efficiency of processing by combining a plurality of fabrication processes to minimize substrate transfer and handling, to maximize the economical utilization of clean room floor space, and to maximize production throughput. Since a substrate wet cleaning is performed after many of the substrate fabrication steps, brush stations are often integrated into a plurality of fabrication and processing systems. By way of example, brush stations may be configured in pairs, side by side, with a pair of spin, rinse, and dry (SRD) tools configured vertically above the brush stations. Two brush stations are used, each with a pair of brushes, to enable the application of chemicals in one brush station and deionized (DI) water in the other. This dual brush station approach has been shown to improve the cleaning performance as well as increase throughput. In another typical configuration, each of the pair of brush stations performs the same scrubbing, cleaning, or other process operation, and the tandem implementation increases efficiency and throughput.

In typical prior art processing systems implementing one or more brush stations, the brush stations are specifically designed and configured for the particular system in which it is to be used, and often designed and configured for a specific location within an integrated system. Although many brush station parts, e.g., the brushes, are interchangeable between the various brush stations, each station is often unique to a particular implementation, and a specific location within the system, and typically requires manufacture of individual and specific components or parts for specific locations or implementations.

In view of the foregoing, there is a need for substrate brush station preparation systems and methods that provide modular and interchangeable brush stations with ease of access for service, ease of configuration for a plurality of system implementations, ease of configuration for a plurality of substrates and substrate sizes, and that maximize the cleaning and processing of wafers and other substrates in order to meet and exceed the ever more stringent cleanliness requirements for fabrication processes.

SUMMARY OF THE INVENTION

Broadly speaking, the present invention fills these needs by providing a substrate processing brush box that is modular and symmetrical in design and implementation enabling ease of configuration and incorporation into a plurality of substrate processing applications. In particular, the edge wheel assembly of the substrate processing brush box provides a modular component of the brush box that is easily configurable to a plurality of applications.

In one embodiment, a modular edge wheel assembly in a brush box for processing a substrate is disclosed. The modular edge wheel assembly includes an edge wheel assembly block and a pair of edge wheels. Each edge wheel is connected to an edge wheel shaft at a processing end, and each edge wheel shaft projects through the edge wheel assembly block through an edge wheel shaft bore. The modular edge wheel assembly further includes an edge wheel drive motor which is configured to drive edge wheel drive pulleys. The edge wheel drive pulleys are connected to a drive end of each edge wheel shaft. The modular edge wheel assembly is configurable to be attached as a unit to one of a right side and a left side of the brush box.

In another embodiment, an edge wheel assembly for supporting a vertically oriented substrate is disclosed. The edge wheel assembly is designed to be inserted into side walls of a brush box. The edge wheel assembly includes an edge wheel assembly block which is capable of interchangeably mounting to either of two side walls of the brush box. The edge wheel assembly also includes a first edge wheel and a second edge wheel mounted to the edge wheel assembly block. Each of the edge wheels has a groove that is capable of supporting the substrate. The first and second edge wheels are further aligned with one another to enable rotation of the supported substrate. The edge wheel assembly further includes a drive motor coupled to a plate. The plate is designed to couple to the edge wheel assembly block at either one of a first side and a second side of the edge wheel assembly block. The first side and the second side of the edge wheel assembly block are external to the brush box.

In yet another embodiment, an edge wheel assembly is disclosed. The edge wheel assembly is used in a semiconductor wafer fabrication brush box, and is configured to support and to rotate a semiconductor wafer in a vertical orientation within the brush box. The edge wheel assembly includes an edge wheel assembly block that has at least two pairs of edge wheel shaft bores through the edge wheel assembly block. Further, the edge wheel assembly block includes a first edge wheel attached to a processing end of a first edge wheel shaft, and a second edge wheel attached to a processing end of a second edge wheel shaft. The first edge wheel shaft and the second edge wheel shaft extend through the edge wheel assembly block in one of the at least two pairs of edge wheel shaft bores. The edge wheel assembly also includes a drive motor coupled to the edge wheel assembly block with a plate. The plate is designed to couple the drive motor to either one of a first position and a second position on the edge wheel assembly block, the first position and the second position are each external to the brush box and enable insertion of the edge wheel assembly into either one of a first side and a second side of the brush box.

The advantages of the present invention are numerous. One notable benefit and advantage of the invention is the modular design. Assembly and component parts of the present invention are designed for configuration to a plurality of implementations of the present invention. Assembly and component parts can be configured for right-hand or left-hand access using the same parts, and thus significantly reducing the cost of manufacture. Instead of typical prior art specially designed and manufactured parts for specific implementations, the present invention incorporates symmetrical design providing for modular parts that can be turned, reversed, or otherwise simply configured for a particular location or implementation. In addition to signifi-cantly reducing the cost of manufacture, training costs are reduced, and serviceability is greatly increased.

Another benefit is the ease with which the present invention is configured for a plurality of substrate sizes. In some substrate processing implementations, it is preferable to utilize brushes or pads that are specifically matched to a substrate size. In one embodiment of the present invention, brushes or pads are easily changed on brush assembly mandrels, or entire brush assemblies can be easily configured for specific substrate sizes, and the brush assemblies implemented in embodiments of the present invention as desired.

An additional benefit is the ability to integrate the system into existing process equipment resulting in increased quality and quantity of product with fewer defects or scrap due to contamination. One embodiment of the invention is of essentially identical dimension as existing brush boxes, and the present invention can be implemented to replace existing tools with embodiments of the present invention with a resulting increase in serviceability and performance.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIG. 4 shows a perspective from the rear of brush box in accordance with an embodiment of the invention.

FIG. 5A is an exploded view of door in accordance with an embodiment of the invention.

FIG. 5B shows another perspective with a plan view of door in accordance with an embodiment of the invention.

FIG. 8C shows another view of a brush drive assembly in accordance with an embodiment of the invention.

FIG. 8D shows another view of a brush drive assembly in accordance with an embodiment of the invention.

FIG. 9B is another exploded view of a brush drive assembly in accordance with an embodiment of the invention.

FIG. 11A shows an exploded view of a single brush drive, in accordance with an embodiment of the invention.

FIG. 11B shows another perspective of an exploded brush drive, in accordance with one embodiment of the present invention.

FIG. 11C shows a detail view of the brush drive housing shown in FIG. 11B.

FIG. 12A is a cross-section view of a brush drive, in accordance with an embodiment of the invention.

FIG. 12B shows a detail view of the mandrel support connector shown in FIG. 12A.

FIG. 12C shows a detail view of the brush drive housing shown in FIG. 12A.

FIG. 13A shows another side plan view of a brush drive assembly in accordance with an embodiment of the present invention.

FIG. 13B is another bottom plan view of a brush drive assembly in accordance with an embodiment of the invention.

FIG. 16A shows an integrated processing tool incorporating a pair of brush boxes in accordance with an embodiment of the invention.

DETAILED DESCRIPTION OF THE PREFERRED EMBODIMENTS

An invention for substrate preparation is disclosed. In preferred embodiments, apparatus and methods include a substrate processing brush box of symmetrical and modular design for implementation in a plurality of substrate processing tools and applications. The substrate processing brush box incorporates a modular brush drive assembly and a modular edge wheel assembly.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
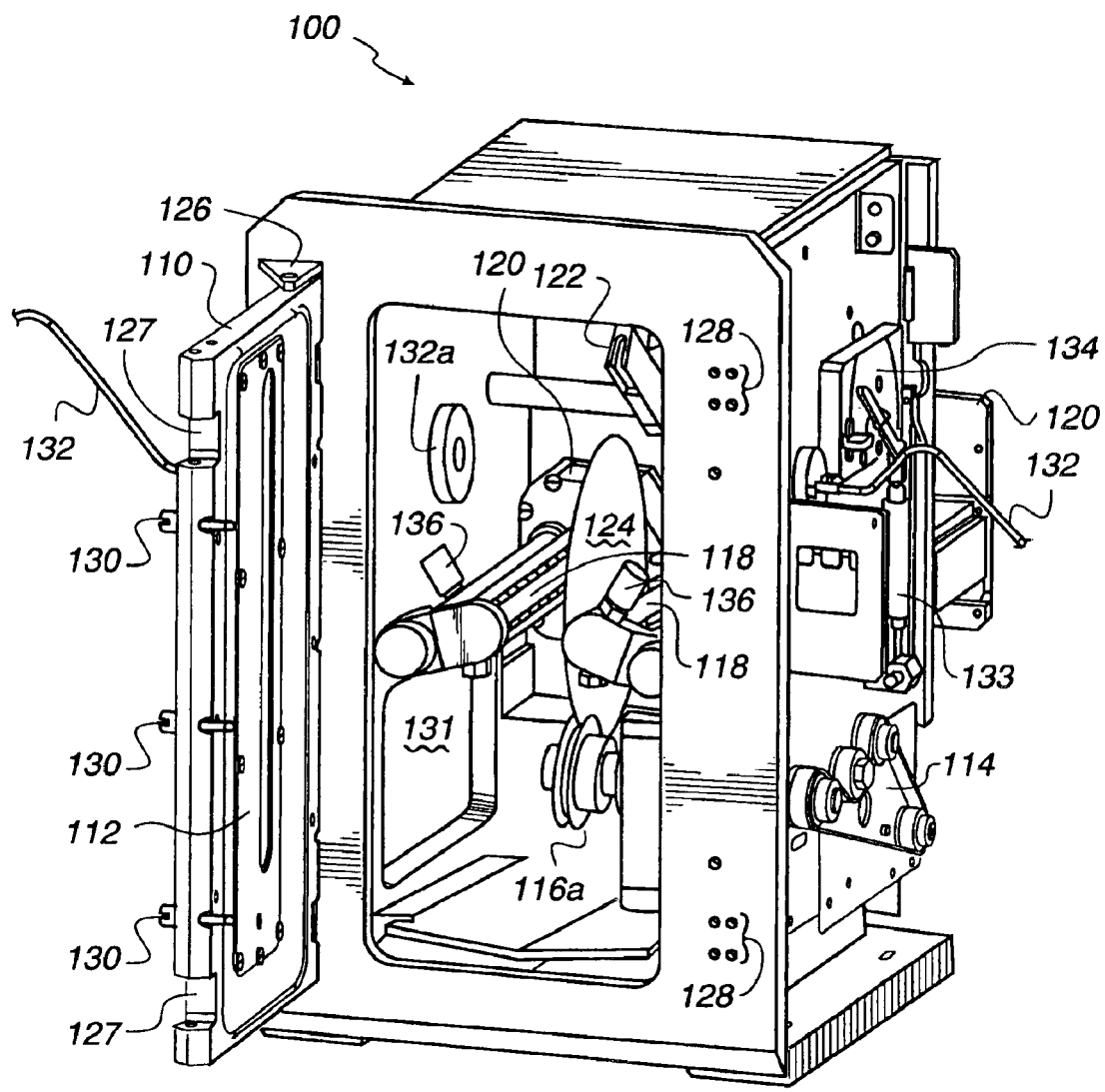
FIG. 1 shows a brush box in accordance with one embodiment of the present invention.

FIG. 1 shows a brush box 100 in accordance with one embodiment of the present invention. In FIG. 1, brush box 100 is shown in an open configuration revealing a number of structural features in the interior of the brush box 100. In one embodiment, brush box 100 is operated with the interior of the brush box 100 at less than atmospheric pressure, and therefore must be sealed. Brush box door 110 provides access to the interior structural components of brush box 100, and provides a surface through which a substrate 124 is inserted into and removed from the interior of the brush box 100. Inner door panel 112 provides an interior structure on the brush box door 110, and a slot door panel (not visible in FIG. 1) is configured in between the brush box door 110 and the inner door panel 112. Slot door panel 142 (see FIG. 5A) provides a seal to contain the interior region of the brush box 110, and in an open position, provides access for inserting or removing a substrate 124.

In one embodiment, an edge wheel assembly 114 is configured to a side of the brush box 100. The modular edge wheel assembly 114 is attached to the illustrated brush box 100 through a side panel and provides support, positioning, cooling, movement, and the like for edge wheels 116 as is described in greater detail below in reference to FIGS. 14A–14E and 15A–15C. In FIG. 1, front edge wheel 116a is shown providing support for a substrate 124 positioned in brush box 100. Rear edge wheel 116b is not visible in the illustrated brush box 100. Front edge wheel 116a and rear edge wheel 116b are configured to support a substrate 124 in a vertical orientation within brush box 100, and to rotate, which rotates the substrate supported thereon.

A substrate stabilizer is configured to support a top edge of substrate 124 when the substrate 124 is positioned on edge wheels 116, and brushes 118 are in a retracted position away from the substrate 124. The substrate stabilizer assembly 134 is configured to a side panel of brush box 100 and includes an actuator 133 and a substrate stabilizer arm 122. In one embodiment, the actuator 133 positions connecting rods in the substrate stabilizer assembly 134 which position the substrate stabilizer arm 122 in brush box 100. In one embodiment, the substrate stabilizer assembly 134 is controlled in conjunction with a substrate sensing system and a brush positioning system to ensure the substrate stabilizer arm 122 is positioned to support the substrate 124 in a vertical orientation only when a substrate is present and the brushes 118 are in a retracted position away from substrate 124 surfaces, or are to be moved into the retracted position. Brush box 100 and substrate stabilizer assembly 132 are configured so that substrate stabilizer assembly 132 can be configured to either side panel of brush box 100 to maximize access for serviceability in a plurality of brush box 100 configurations and implementations.

In FIG. 1, substrate 124 is positioned between brushes attached to brush cores 118 which are mounted on counter-rotating mandrels (not visible in FIG. 1) and configured to a brush drive assembly 120. The brush drive assembly 120 is configured through the rear of brush box 100, and is described in greater detail below in reference to FIGS. 6A–13C. In one embodiment of the invention, the brush drive assembly 120 is generally configured to counter-rotate mandrels (not visible) with brushes and brush cores 118 attached thereto. The counter-rotating brushes are applied to opposing surfaces of substrate 124, which is rotated by front edge wheel 116a and rear edge wheel 116b (not visible). The brush drive assembly 120 is configured to supply fluid for cleaning, polishing, buffing, and the like through the counter-rotating brushes. In one embodiment, fluid is supplied to the fluid delivery system through brushes and brush cores 118 at fluid delivery fitting 136.

Also shown in FIG. 1 is wafer sensing apparatus 132. Wafer sensing apparatus 132 is configured to each side panel of brush box 100 and senses the presence of a substrate 124 in processing position within brush box 100. In one embodiment, wafer sensing apparatus 132 is a fiberoptic system that senses the presence of substrate 124 in processing position between brushes on brush cores 118 and on the edge rollers 116. In one embodiment, the wafer sensing apparatus 132 transmits the state of substrate presence to a system controller (not shown) to enable or disable a plurality of functions of and within brush box 100. By way of example, position of substrate stabilizer arm might be enabled by presence of a substrate, opening of door 110 might be disabled by presence of a substrate, delivery of fluids through the fluid delivery system might be enabled by the presence of a substrate, and the like.

In accordance with one embodiment of the present invention, brush box 100 is of a symmetrical and modular configuration about a vertical axis or center line through brush box 100 to enable integration into a plurality of fabrication and processing tools. In one embodiment of the invention, brush box 100 is typically implemented as a right-hand or a left-hand brush box 100 within a system. In fabricating brush box 100 as essentially symmetrical about a vertical center line, components of the brush box 100 that are typically mirrored as right and left components, or right and left brush box 100 assemblies, are generally fabricated as essentially identical parts that are mounted, configured, attached, and the like as mirror images, as will be illustrated and described in several examples below. Additionally, symmetrical configuration minimizes fabrication of specialized component parts of brush box 100. By way of example in FIG. 1, door 110 is shown with hinges 126 on the left side of door 110, and securing screws 130 along the right edge of door 10. Door 110 is easily configured to be hinged on the right side with hinges 126 attached to hinge cut outs 127 on door 110 and affixed in holes 128 in the front panel of brush box 100. Similarly, securing screws 130 can be attached along left edge of door 110. In this manner, door 110 is easily configured for either right hand or left hand opening, using the same parts for either configuration.

In FIG. 1, edge wheel assembly 114 is shown attached to brush box 100 through the right panel. In one embodiment of the invention, brush box 100 might be configured to a fabrication or processing tool, or integrated processing system, so that access and serviceability of brush box 100 is maximized. As will be described in greater detail below in reference to FIGS. 14A–15C, edge wheel assembly 114 is configurable through either the right or the left panel of brush box 100. Additionally, edge wheel assembly 114 is configurable through either the right or left panel of brush box 100 using substantially the same assembly and support/mounting parts in either position. As can be seen in FIG. 1, an edge wheel assembly mounting position 131 is visible in the left panel of brush box 100. The position of the edge wheel assembly 114 is then easily configured depending on the specific application or location of brush box 100 within a tool or integrated processing system.

The modular design of brush box 100 is implemented in both the general structure of the brush box 100 and in the individual assemblies incorporated into brush box 100. By way of example, one embodiment of the present invention can be implemented in a wafer fabrication cleaning and drying tool which includes two brush boxes 100 side-by-side, and two SRD tools mounted vertically over the brush boxes, one SRD over each brush box 100 (see FIGS. 16A and 16B). The tool might be configured in a stand or rack to supply power, gas or liquid chemistry, water, exhaust, drainage, and the like. In such a tool, each of the integrated brush boxes 100 might be configured to provide maximum serviceability and access with exterior configuration of the edge wheel insert assemblies 114, doors 10 configured to open toward the center of the tool, and the like. Each brush box 100 might be configured for a particular application and location, but using substantially the same brush box 100 and support/mounting structures in each configuration.

Figure 2:
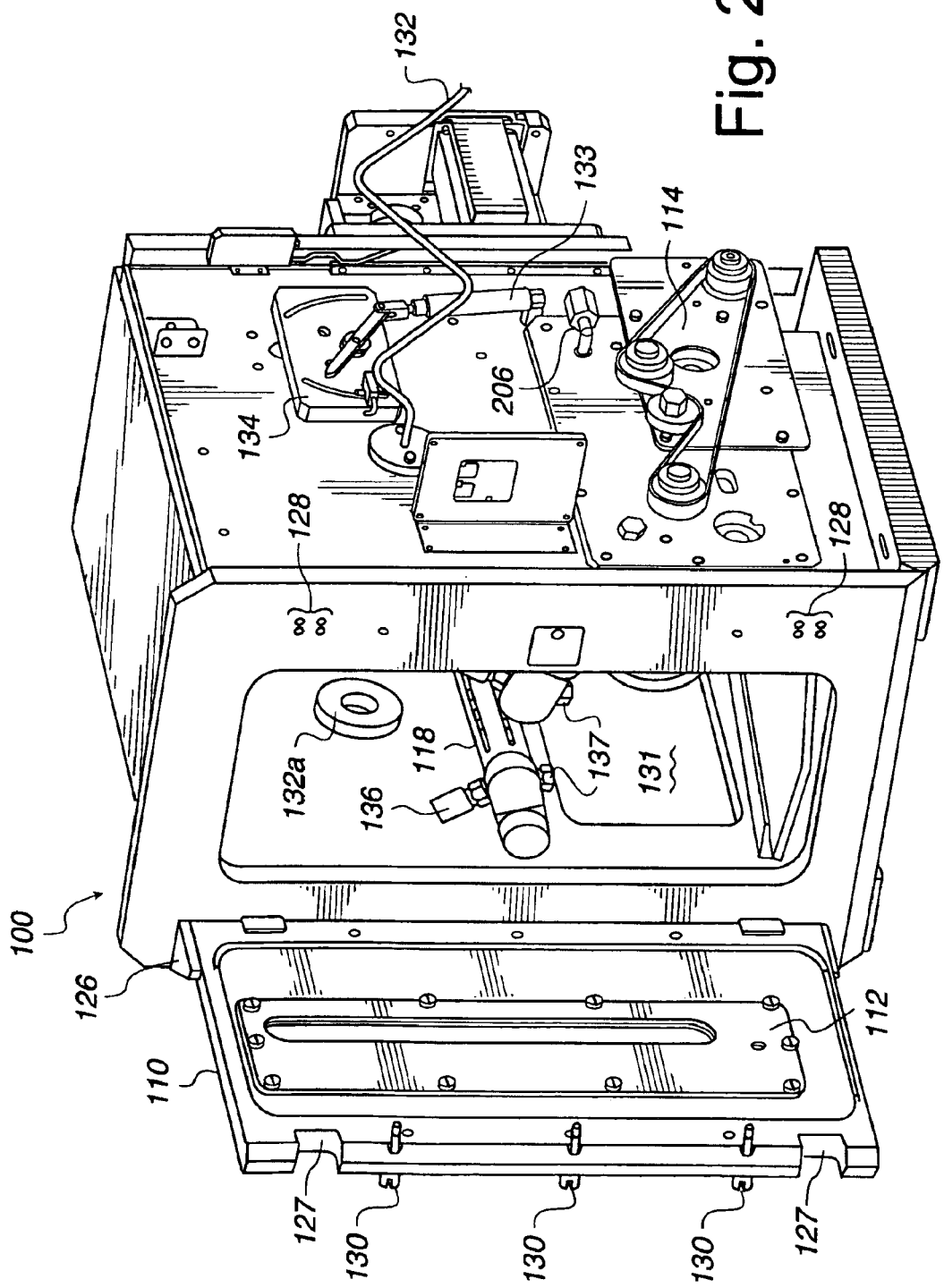
FIG. 2 shows another view of brush box in accordance with an embodiment of the invention.
Figure 3:
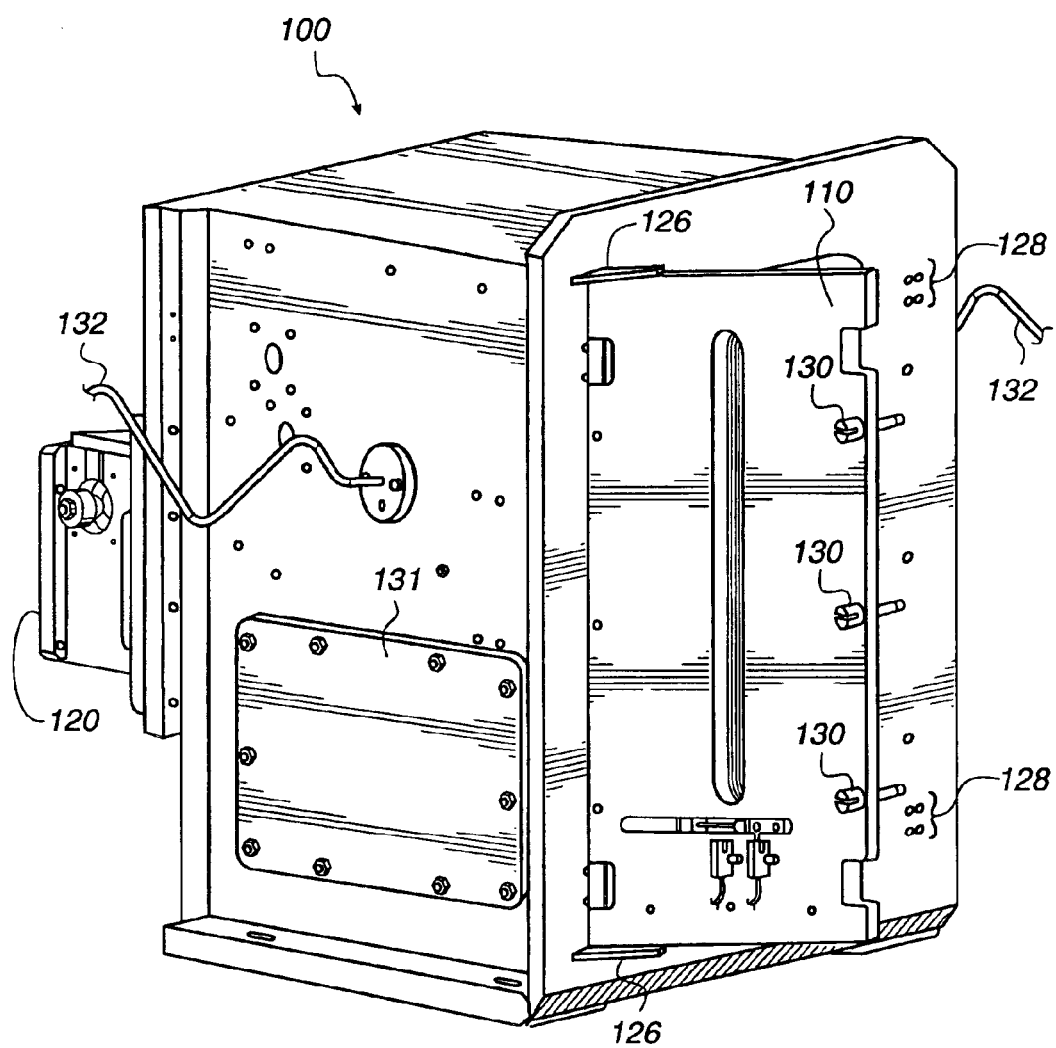
FIG. 3 shows another perspective of brush box 100 in accordance with an embodiment of the invention.

FIGS. 2–4 show additional views of brush box 100 with various features as described above identified from a plurality of angles in accordance with an embodiment of the invention. FIG. 2 shows another view of brush box 100 in accordance with an embodiment of the invention. In FIG. 2, brush box 100 is once again shown in an open configuration. Brush box door 100 provides access into an interior region of brush box 100, and is attached to brush box 100 at hinges 126. Brush box door can be secured to the brush box 100 body with securing screws 130 along an edge opposite hinges 126. Hinge cut outs 127 on brush box door 110, and corresponding holes 128 on brush box 100 illustrate the ability to configure brush box door 110 to open from either edge utilizing the same component parts. On the interior of brush box door 110 is inner door panel 112. Brush box door is described in greater detail below in reference to FIGS. 5A and 5B.

Wafer sensing apparatus 132 senses the presence of a substrate in processing position within brush box 100, between brushes on brush rollers 118 and supported on edge wheels 116. Wafer sensing interior flange 132a is visible on an interior wall of brush box 100. Also visible in an interior of brush box 100 are brush cores 118, fluid delivery fittings 136, and fluid delivery plugs 137 which are described in detail below in reference to FIGS. 6A–13C which illustrate embodiments of the brush drive assembly 120.

Edge wheel assembly 114 includes the various components associated with the edge wheels 116 (front edge wheel 116a is shown in FIG. 2), including edge wheel assembly block fitting 206 which provides a connection for fluid supply to the components of the edge wheel assembly 114. As described in greater detail in reference to FIGS. 14A–15C, the symmetrical design of the edge wheel assembly 114 provides for the ability to position the edge wheel assembly 114 in either of a fight panel or a left panel of brush box 100. In FIG. 2, an edge wheel assembly mounting position 131 is visible in a panel of brush box 100 opposite edge wheel assembly 114.

Above edge wheel assembly 114 in FIG. 2 is the substrate stabilizer assembly 134 and actuator 133 as described above in reference to FIG. 1. Substrate stabilizer arm 122 (see FIG. 1) is not visible in FIG. 2.

FIG. 3 shows another perspective of brush box 100 in accordance with an embodiment of the invention. In FIG. 3, door 110 is in an open position, but the interior of brush box 100 is not visible. As described above, door 110 can be configured to brush box 100 to open from either edge, and is attached to brush box 100 with hinges 126 and securing screws 130. Holes 128 and hinge cut-outs 127 accept hinges 126 when attaching brush box door 110 to brush box 100.

FIG. 3 also shows another perspective of wafer sensing apparatus 132, and an exterior view of edge wheel assembly mounting position 131. That portion of the brush drive assembly 120 exterior to the brush box 100 is shown in a rear section of brush box 100.

FIG. 4 shows a perspective from the rear of brush box 100 in accordance with an embodiment of the invention. As in FIG. 3, that portion of the brush drive assembly 120 that remains exterior to brush box 100 is visible in FIG. 4. Also shown is edge wheel assembly 114, including edge wheel drive motor 202 which remains in an external location to brush box 100. The wafer sensing apparatus 132, substrate stabilizer assembly 134 and actuator 133, and a view of holes 128 that accept hinges 126 (not shown) are all identified in FIG. 4.

FIGS. 5A and 5B show additional detail of door 110 in accordance with an embodiment of the present invention. FIG. 5A is an exploded view of door 110 in accordance with an embodiment of the invention. In FIG. 5A, door 110 is shown with hinges 126 attached to the right side of door 110, and securing screws 130 configured along the left edge of door 110. Consistent with the overall design of brush box 100 in one embodiment, door 10 is substantially symmetrical and configurable to be attached to brush box 100 with hinges 126 on either the right side of door 110 or on the left side of door 110. Hinge cut outs 127 are shown opposite hinges 126, and attachment points are provided for securing screws 130 along both the right and left edges of door 110 to be configured with securing screws 130 along whichever edge is opposite the hinges 126. A single door 110 is thus provided to be configured for a plurality of brush box 100 applications and configurations, and can be manufactured as a single component part rather than a specialized part for a particular application, location or configuration.

Slot 140 is provided in substantially the center of door 110. Slot 140 is generally configured to provide access to brush box 100 for the insertion or extraction of a substrate 124 (not shown). Slot door 142 is positioned between door I 10 and door inner panel 112 and provides for scaling the interior of brush box 100. In one embodiment, slot door 142 is configured to slide into either one of an open position or a closed position between door 110 and door inner panel 112. Door inner panel 112 is therefore larger on one side of slot 140 than on the other. In order to maintain the symmetrical design of brush box 100, inner door panel 112 is configured to be reversible to accommodate the sliding of slot door 142 to an open position on either the right or left side of slot 140.

FIG. 5B shows another perspective with a plan view of door 110 in accordance with an embodiment of the invention. Identified features of door 110 in FIG. 5B include hinges 126, hinge cut outs 127, securing screws 130, and door inner panel 112.

Figure 6A:
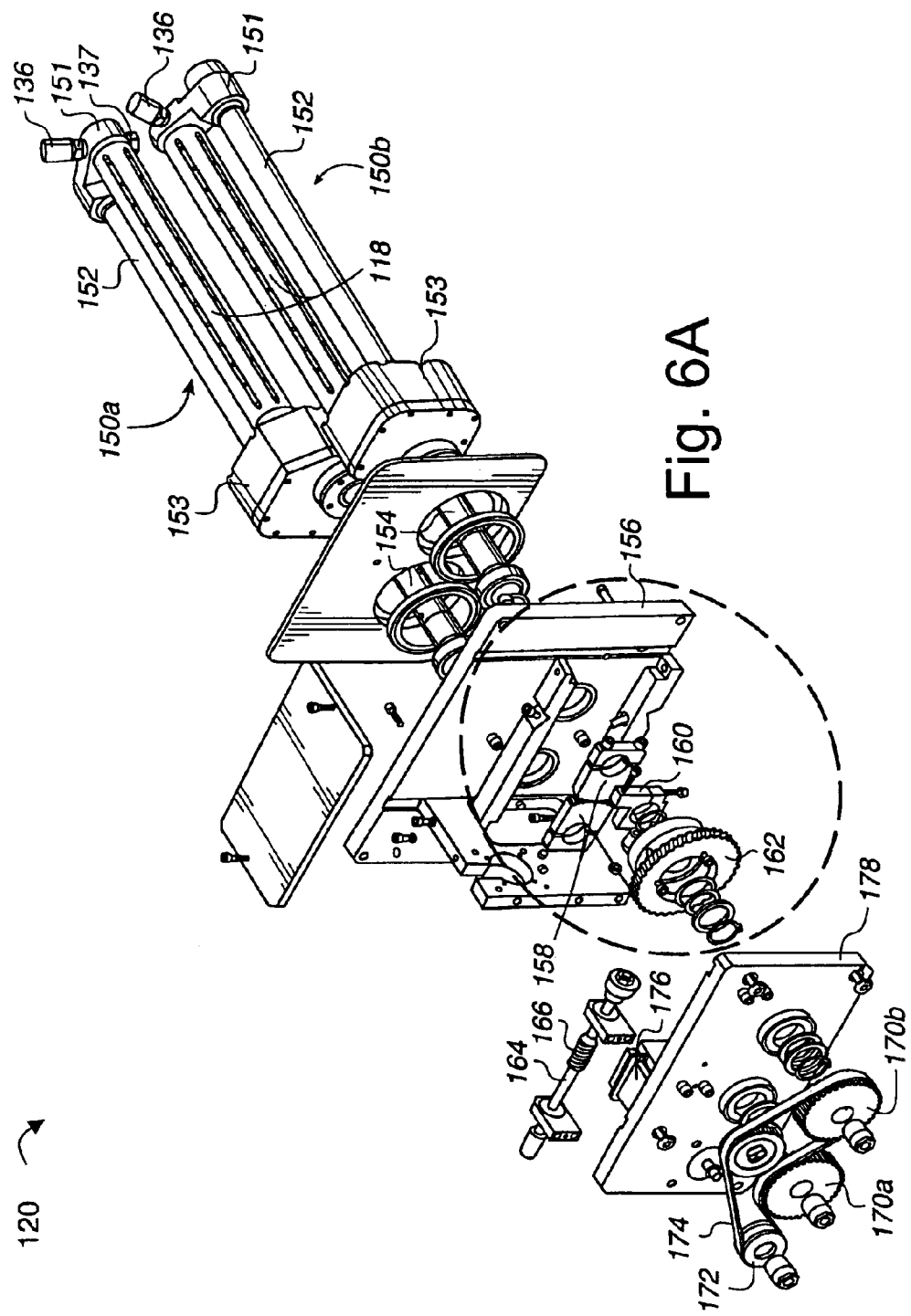
FIG. 6A shows a detail view of the brush drive assembly in accordance with one embodiment of the present invention.
Figure 6B:
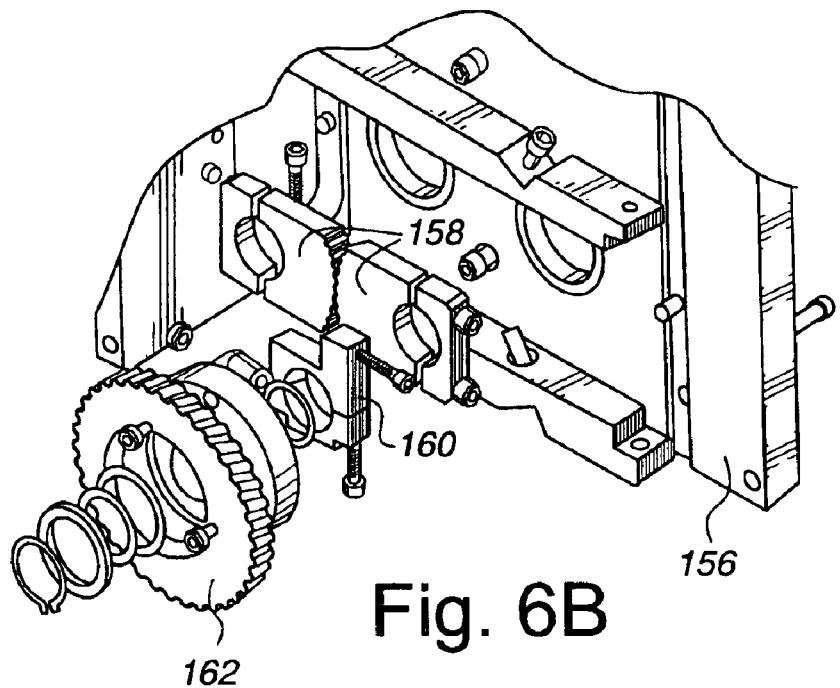
FIG. 6B shows a detailed view of brush angle gears, load cell, and worm gear in accordance with an embodiment of the invention.

FIGS. 6A and 6B show a detail view of the brush drive assembly 120 in accordance with one embodiment of the present invention. Referring to FIG. 6A, brush drive assembly 120 includes a right brush drive 150a and a left brush drive 150b which are assembled from substantially identical parts configured to face each other and to be pivoted into a desired position as will be described below. In one embodiment, right brush drive 150a and left brush drive 150b are configured with brushes attached to brush cores 118 mounted on counter rotating mandrels (not visible). Mandrel support arms 152 are provided for support of the mandrel, brush, and brush core 118 structures. Each mandrel support arm 152 and mandrel (not visible) is connected on one end to a brush drive housing 153. Brush drive housing 153 is configured to house gears to impart rotation of brush drive shaft 154 to mandrel and, in one embodiment, the side-by-side right brush drive 150a and left brush drive 150b are configured with counter-rotating mandrels. A mandrel support connector 151 is provided at a distal end of the right brush drive 150a and the left brush drive 150b to connect the mandrel and the mandrel support arm 152. A bearing (not visible) is provided to allow the mandrel to rotate freely in the mandrel support connector 151. In one embodiment, the mandrel support arm 152 is configured to be substantially rigid and fixed in place.

In one embodiment of the invention, fluids used for cleaning, polishing, buffing, rinsing, and the like are delivered through brushes attached to brush cores 118 and applied to substrate surfaces by the brushes. Fluids are supplied to the interior of mandrels (not visible) at fluid delivery fittings 136. In one embodiment, the structure of the right brush drive 150a is substantially identical to the structure of left brush drive 150b. Fluid delivery plugs 137 are provided to allow the fluid delivery fittings 136 to be configured to a top surface of each brush drive 150, and allow the substantially identical brush drives 150 to be configured to either a right or a left position in brush drive assembly 120. Configuration is accomplished by turning, rotating, flipping, reversing, or otherwise re-positioning essentially identical component parts into a right or left, top or bottom, position.

In one embodiment, fluid delivery through the brush is supplemented with fluid delivery through a manifold (not shown) configured in or to mandrel support arms 152. Fluid is sprayed, dripped, or otherwise dispensed through manifolds (not shown) that span the length of mandrel support arms 152. In one embodiment, fluid delivery is configured to include at least two separate systems such that one fluid delivery system supplies fluid through mandrels and brushes through fluid delivery fittings 136, and another fluid delivery system supplies fluid through manifolds through what is shown in FIG. 6A as fluid delivery plugs 137. In this manner, by way of example, chemistries can be mixed on the surface of a substrate and used for cleaning, polishing, buffing, and the like, or a rinse operation can immediately follow a process utilizing a processing chemistry, or any other desired combination of same or different fluid or chemistry delivery. In one embodiment, the fluid delivery system includes a common delivery through both the mandrels and brushes 118, and through manifolds along mandrel support arms 152.

Brush drive housings 153 are attached to brush drive front mounting plate 156, and configured to provide for the positional pivoting of right brush drive 150a and left brush drive 150b, and, in one embodiment, to seal the gears, bearings, bushings, and such structures configured to impart rotational force to the mandrels. Brush drive shafts 154 extend through brush drive front mounting plate 156 and are configured to rotate. One end of the brush drive shafts 154 terminates in brush drive housing 153 where the rotation of brush drive shafts 154 is imparted through gears, in one embodiment, to mandrels (not shown) of the right brush drive 150a and the left brush drive 150b. In one embodiment, brush drive front mounting plate 156 defines a barrier between the structures that will be within brush box 100 (see FIGS. 14) including brush drive housings 153 and right and left brush drives 150a, 150b, and those structures that will be external to the brush box 100.

In one embodiment, the rotation of the mandrels is caused by a motor 176 configured to a brush drive rear mounting plate 178. Motor 176 turns brush rotating drive pulley 172. Belt 174 connects brush rotating drive pulley 172 to right brush rotating pulley 170a and left brush rotating pulley 170b, and is configured to turn right brush rotating pulley 170a and left brush rotating pulley 170b in opposite directions. Right brush rotating pulley 170a and left brush rotating pulley 170b drive brush drive shafts 154, resulting in the counter-rotation of the mandrels.

In addition to counter-rotating mandrels, one embodiment of the invention provides for pivoting right brush drive 150a and left brush drive 150b to bring brushes on brush cores 118 together, and to separate brushes on brush cores 118 to create an opening between brushes of the right brush drive 150a and the left brush drive 150b. Referring to FIG. 1, brushes on brush cores 118 are separated in order to enable substrate 124 to be inserted in between the brushes. Once substrate 124 is in place in between brushes, supported on edge rollers 116, and stabilized by substrate stabilizer arm 122, brushes on brush cores 118 are positioned together to contact opposing surfaces of substrate 124. In one embodiment, the cleaning, polishing, buffing, and the like of a substrate 124 is enhanced and/or manipulated by the application of varying degrees of force against the opposing surfaces of substrate 124 by brushes attached to brush cores 118.

Returning to FIG. 6A, brush angle gears 158 are configured to position brush drive shafts 154 to coordinately move right brush drive 150a and left brush drive 150b to move the brushes on brush cores 118 together and to separate the brushes attached to brush cores 118. In one embodiment, the positioning of brush drive shafts 154 by brush angle gears 158 pivots the right brush drive 150a and the left brush drive 150b. Brush drive housings 153 are configured to allow the coordinate movement of the right brush drive 150a and the left brush drive 150b in equal and opposite directions. As right brush drive 150a pivots in a direction to position right brush on brush core 118 towards a center axis between the right brush drive 150a and the left brush drive 150b, the left brush drive 150b pivots in the opposite direction positioning the left brush on brush core 118 towards the same center axis between the right brush drive 150a and the left brush drive 150b. Brush angle gears 158 are configured to position brush drive shafts 154 in equal and opposite directions of movement. Brush drive housings 153 are configured to allow a maximum range of motion for right brush drive 150a and left brush drive 150b to pivot brushes attached to brush cores 118 towards a center axis where a substrate would be positioned in a vertical orientation, and as well to pivot brushes away from the center axis providing for the insertion or removal of a substrate.

In one embodiment, movement of the brush angle gears 158 is driven by worm gear 162. Worm shaft 164 is rotated to spin worm drive 166 which drives worm gear 162. Movement of worm gear 162, therefore, results in torque being applied to brush drive shaft 154. In one embodiment, worm shaft 164, worm drive 166, and worm gear 162 provide for positive, precise positioning of brush drives 150a, 150b. Interlocked brush angle gears 158 ensure movement of right brush drive 150a is equal and opposite to that of left brush drive 150b.

Until brushes attached to brush cores 118 contact opposite sides of a substrate (not shown), resistance to pivotal positioning of right brush drive 150a and left bush drive 150b is generally limited to friction between gears, bearings, and the like. Once the brushes, however, contact opposite surfaces of a substrate (not shown), measurable force can be applied in order to position brushes attached to brush cores 118, resulting in measurable force applied against the surfaces of the substrate. In one embodiment, frictional resistance is calibrated and accommodated, and the force applied to position the brushes attached to brush cores 118 is measured, and is approximately equal to the force applied the wafer surface, with reasonable calculation. In one embodiment, a load cell 160 is provided to measure the force applied to position brushes, enabling the measurement of force applied to substrate surfaces. The ability to measure and control the force applied to substrate surfaces by brushes enables more precise and controlled substrate processing. In one embodiment, a load cell (not shown) is configured to the edge wheels (see FIGS. 14A–15C) to measure the force of the substrate downward on the edge wheels as a component of the force applied to the substrate surfaces.

FIG. 6B shows a detailed view of brush angle gears 158, load cell 160, and worm gear 162. The component parts precisely control the pivoting of right and left brush drives 150a, 150b (see FIG. 6A), and in one embodiment, worm gear 162 and associated structures enable controlled, incremental positioning of brush drives in order to apply desired and measurable force against substrate surfaces for processing. The illustrated component parts, all on the same side of brush drive front mounting plate 156, are external to the brush box 100 (see FIG. 1) when brush drive assembly 120 is configured to brush box 100.

Referring once again to FIG. 6A, in one embodiment, each of the component parts of brush drive assembly 120 that is implemented in pairs (e.g., brush positioning pulleys 170a and 170b, brush angle gears 158, brush drive shafts 154, brush drive housings 153, brush drives 150a and 150b, brush cores 118, and the like) are manufactured as identical component pieces, and then configured for a particular (e.g., right or left) implementation in brush drive assembly 120. Cost of manufacture is significantly decreased by reduction in specialized part manufacture, and serviceability is significantly increased. In one embodiment, most assemblies that include a right and left (or top and bottom) component part use identically manufactured parts that are reversed, turned, or otherwise configured to be implemented in a desired location.

In one embodiment of the invention, right brush drive 150a and left brush drive 150b are configured to process a plurality of substrate sizes. By way of example, each of a 300 mm and a 200 mm semiconductor wafer, or any other desired size semiconductor wafer, can be processed by the same configuration of brush drives 150a and 150b. In another embodiment, brush drives 150a and 150b are configurable for a specific substrate size. By way of example, one size of brushes and brush cores 118 implemented on brush drives 150a and 150b are designed and configured for a 200 mm semiconductor wafer, and a different set of brushes and brush cores 118 are implemented on brush drives 150a and 150b that are designed and configured for a 300 mm semiconductor wafer. The modular design of brush drive assembly 120 enables substrate processing with a brush drive assembly 120 designed for processing a plurality of substrate sizes, or the brush drive assembly 120 can be removed and replaced to customize a particular brush drive assembly 120 for processing a particular substrate size.

Figure 7A:
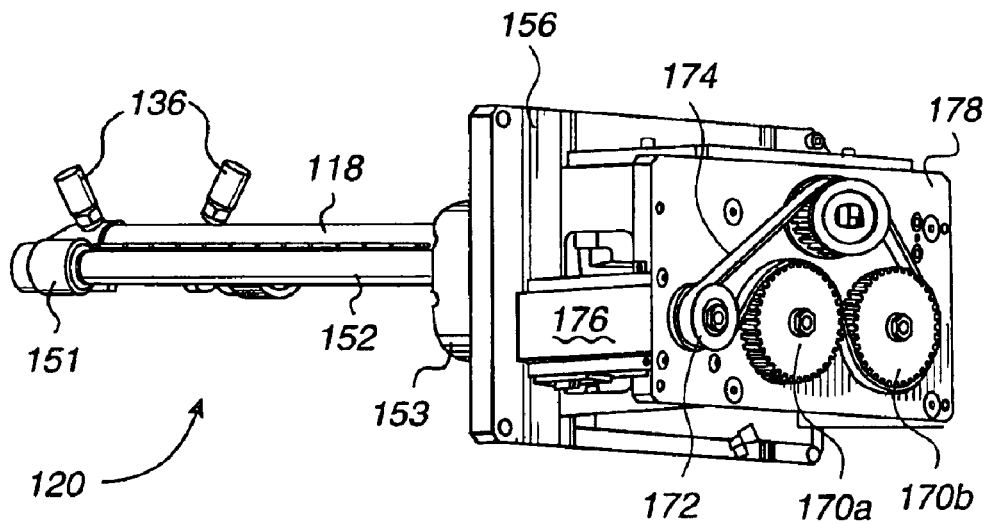
FIG. 7A shows a view of the brush drive assembly in accordance with an embodiment of the invention.

FIGS. 7A–13C show additional views of brush drive assembly 120 with various features as described above identified from a plurality of angles in accordance with an embodiment of the invention. FIG. 7A shows a view of the brush drive assembly 120 in accordance with an embodiment of the invention. Identified features include fluid delivery fittings 136, mandrel support connector 151, mandrel support arm 152, brush core 118, and brush drive housing 153. Also shown are brush rotating drive pulley 172, right brush rotating pulley 170a, left brush rotating pulley 170b, belt 174, and motor 176, at brush drive rear mounting plate 178, and behind brush drive front mounting plate 156.

Figure 7B:
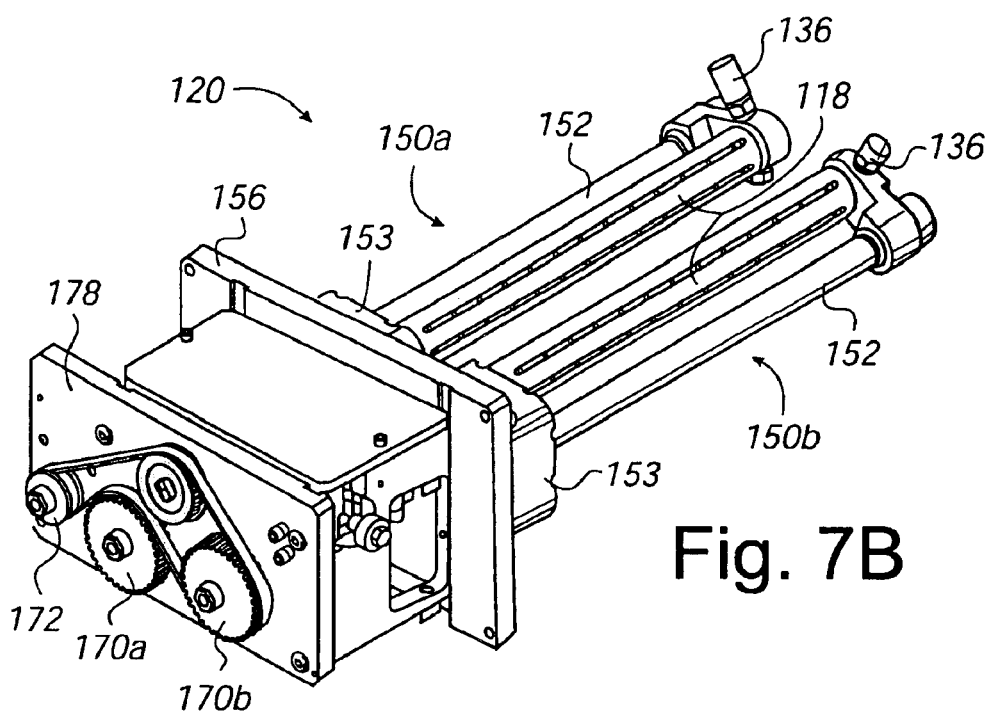
FIG. 7B shows another perspective of a brush drive assembly in accordance with an embodiment of the invention.

FIG. 7B shows another perspective of brush drive assembly 120 in accordance with an embodiment of the invention. Identified features in FIG. 7B include right and left brush drives 150a, 150b, having fluid delivery fittings 136, mandrel support arms 152, brush cores 118, and brush drive housings 153. The brush drive front mounting plate 156 and the brush drive rear mounting plate 178 are also identified. Brush rotating drive pulley 172, right brush rotating pulley 170a, left brush rotating pulley 170b are shown at the brush drive rear mounting plate 178.

Figure 7C:
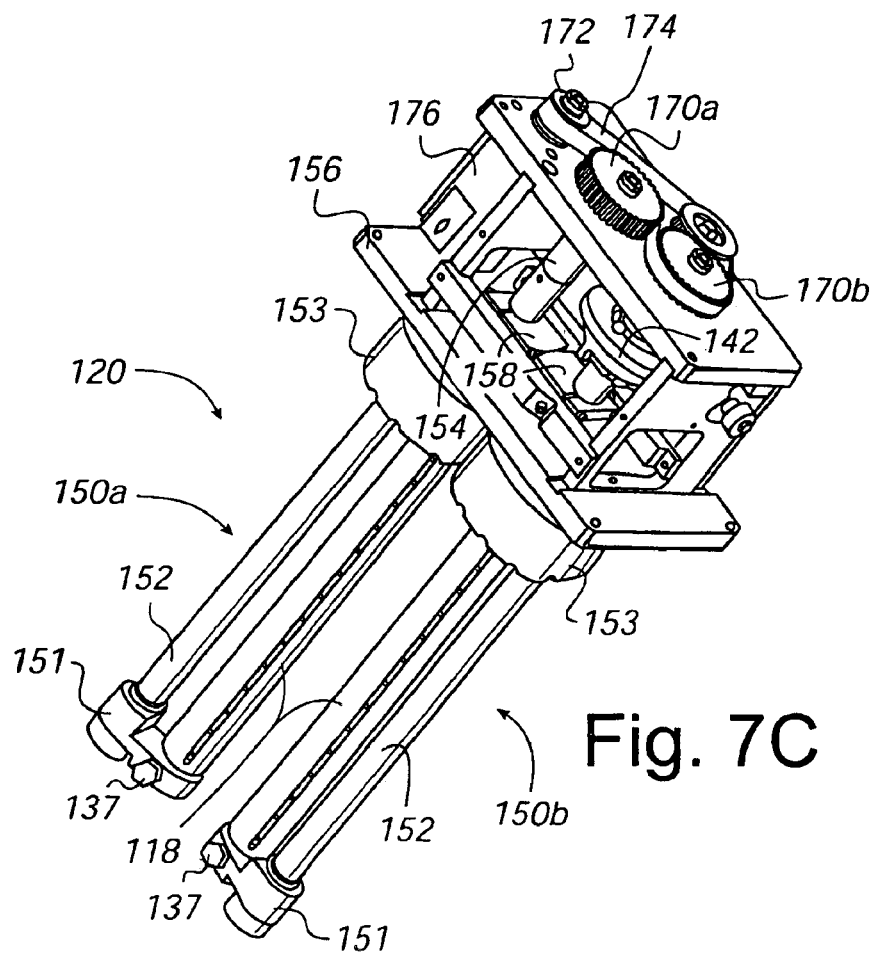
FIG. 7C shows another perspective of a brush drive assembly in accordance with an embodiment of the invention.

FIG. 7C shows another perspective of a brush drive assembly 120 in accordance with an embodiment of the invention. In FIG. 7C, identified features include a right brush drive 150a and a left brush drive 150b having brush drive housings 153, brush cores 118, and mandrel support arms 152. Opposite the brush drive housings 153 are mandrel support connectors 151 having fluid delivery plugs 137. Brush drive front mounting plate 156 separates those structures that will be inserted into, and those structures that will remain external to the brush box 100 (see FIG. 4). Additional identified features include brush angle gears 158, brush drive shafts 154, worm gear 162, motor 176, brush rotating drive pulley 172, right brush rotating pulley 170a, left brush rotating pulley 170b, and belt 174.

Figure 8A:
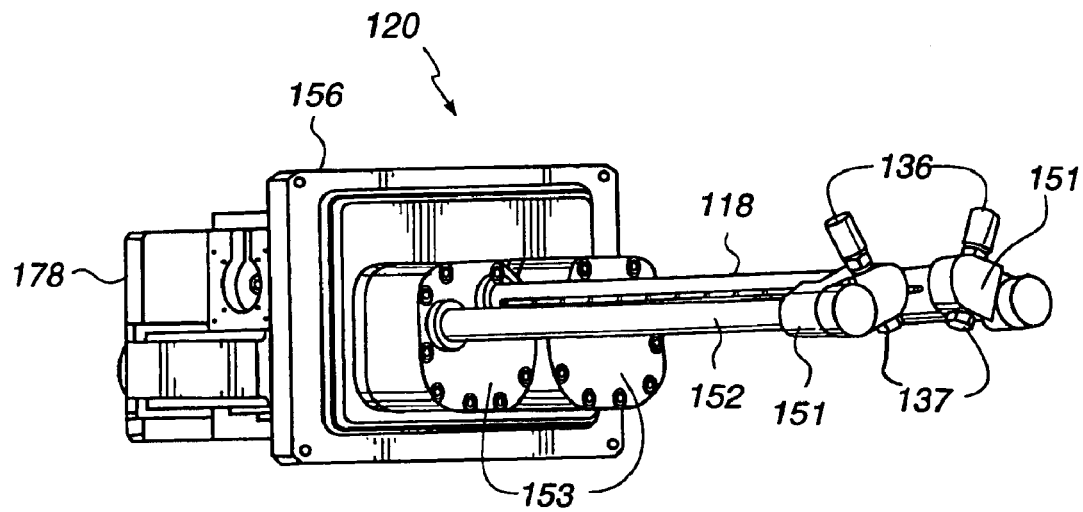
FIG. 8A shows a view of a brush drive assembly in accordance with an embodiment of the present invention.

FIG. 8A shows a view of a brush drive assembly 120 in accordance with an embodiment of the present invention. Identified features in FIG. 8A include brush drive rear mounting plate 178, and brush drive front mounting plate 156. Brush drive housings 153, are shown with mandrel support arms 152, brush cores 118, and mandrel support connectors 151 having fluid delivery fittings 136 and fluid delivery plugs 137.

Figure 8B:
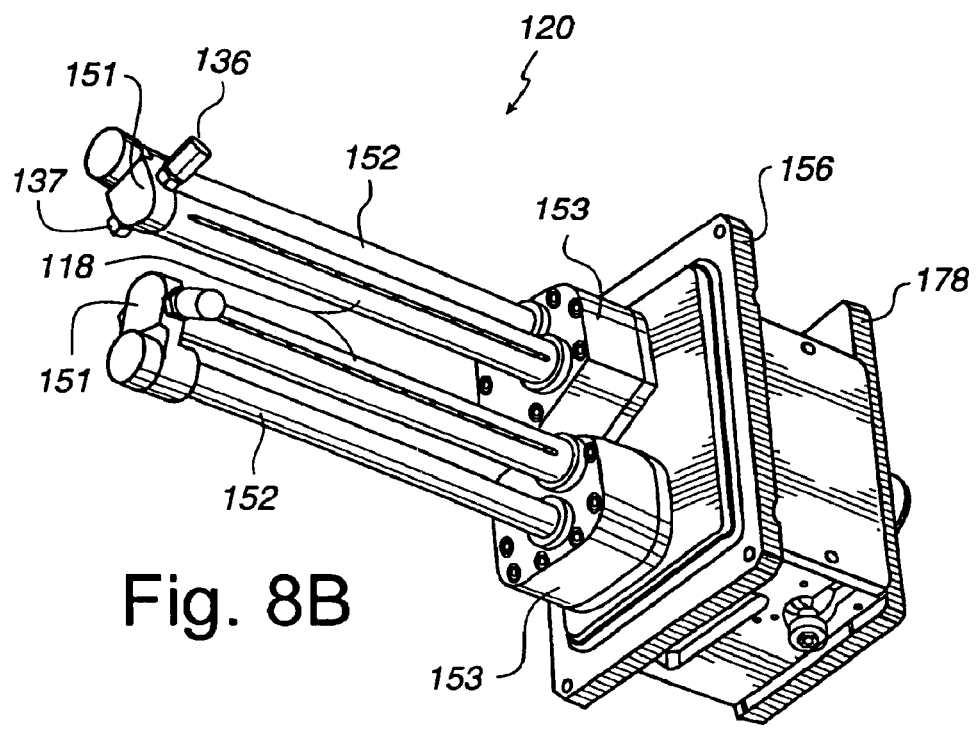
FIG. 8B shows another view of a brush drive assembly in accordance with an embodiment of the invention.

FIG. 8B shows another view of a brush drive assembly 120 in accordance with an embodiment of the invention. Features identified in FIG. 8B include brush drive rear mounting plate 178, and brush drive front mounting plate 156. Brush drive housings 153, are shown with mandrel support arms 152, brush cores 118, and mandrel support connectors 151 having fluid delivery fittings 136 and fluid delivery plugs 137.

FIG. 8C shows another view of a brush drive assembly 120 in accordance with an embodiment of the invention. Features identified in FIG. 8C include brush drive rear mounting plate 178, brush drive shafts 154, and brush drive front mounting plate 156. Brush drive housings 153, are shown with mandrel support arms 152, brush cores 118, and mandrel support connectors 151 having fluid delivery fittings 136 and fluid delivery plugs 137.

FIG. 8D shows another view of a brush drive assembly 120 in accordance with an embodiment of the invention. In FIG. 8D, identified features include brush drive rear mounting plate 178, motor 176, brush rotating drive pulley 172, right brush rotating pulley 170a, left brush rotating pulley 170b, and belt 174. Also identified are brush drive front mounting plate 156, brush drive housings 153 with mandrel support arms 152, mandrel support connectors 151, fluid delivery fittings 136 and fluid delivery plugs 137.

Figure 9A:
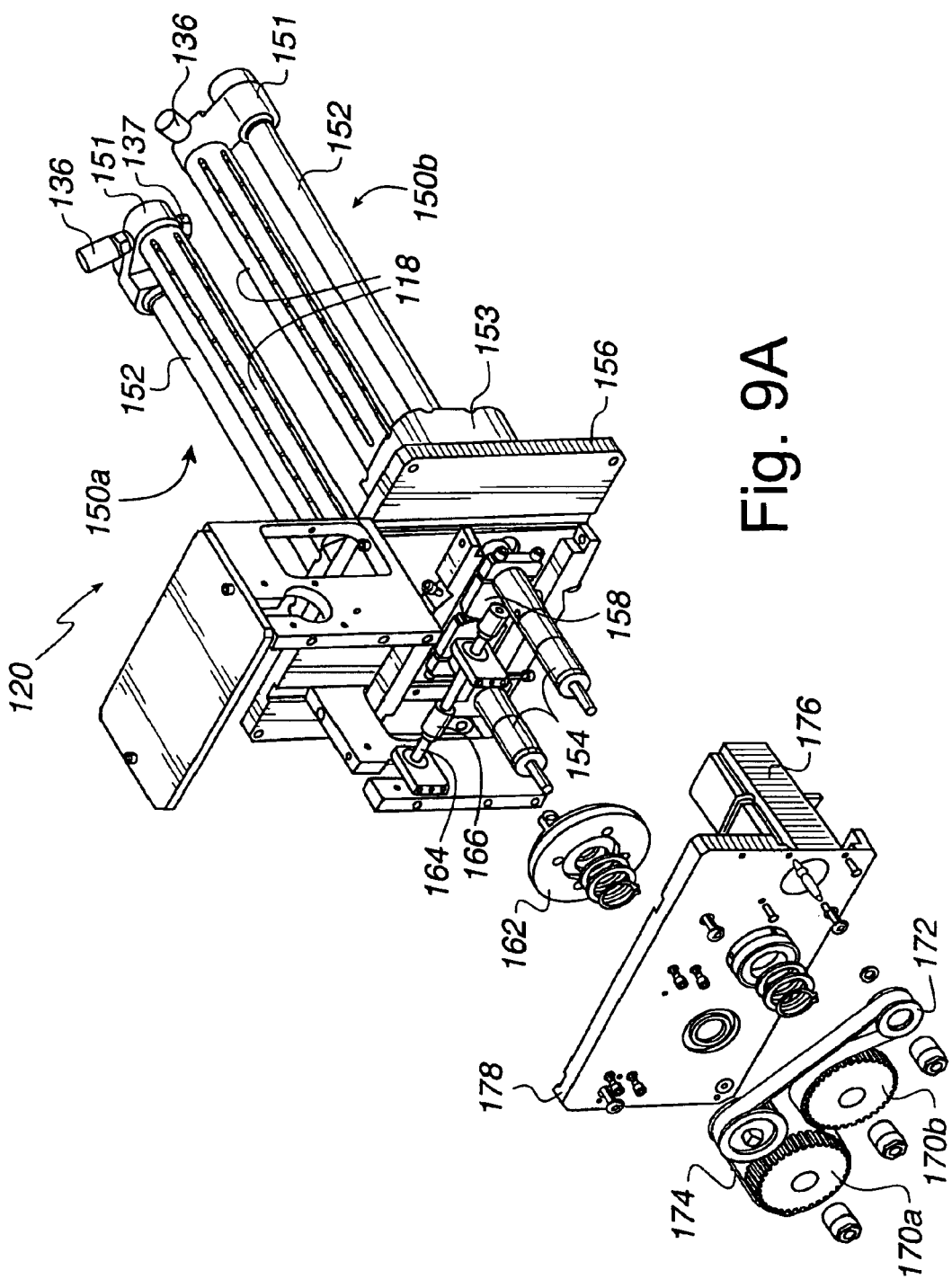
FIG. 9A is an exploded view of a brush drive assembly in accordance with another embodiment of the present invention.

FIG. 9A is an exploded view of a brush drive assembly 120 in accordance with another embodiment of the present invention. Features identified in FIG. 9A include motor 176 attached to brush drive rear mounting plate 178. Right brush rotating pulley 170a, left brush rotating pulley 170b, and brush rotating drive pulley 172 are interconnected with belt 174. Worm gear 162, worm shaft 164, worm drive 166, and brush drive shafts 154 are shown aft of brush front mounting plate 156. Right and left brush drives 150a, 150b include brush drive housings 153 with mandrel support arms 152, brush cores 118, mandrel support connectors 151, fluid delivery fittings 136 and fluid delivery plugs 137.

FIG. 9B is another exploded view of a brush drive assembly 120 in accordance with an embodiment of the invention. Features identified in FIG. 9B include brush drive rear mounting plate 178 and brush front mounting plate 156. Right and left brush drives 150a, 150b include brush drive housings 153 with mandrel support arms 152, brush cores 118, mandrel support connectors 151, fluid delivery fittings 136 and fluid delivery plugs 137. Brush drive shafts 154 translate the rotary drive force generated by motor 176 (see FIG. 9A) to counter-rotate mandrels and brushes on brush cores 118 through, in one embodiment, interconnecting gears within brush drive housings 153.

In one embodiment, right and left brush drives 150a, 150b are within an interior region of brush box 100 (see FIG. 1), and associated drive components as described herein and located on an opposite side of brush front mounting plate 156 are outside of or exterior to the processing area of brush box 100. Chemistries and other processing fluids used to process substrates within brush box 100 are contained within the brush box 100 processing region by seals 156a, and additional seals (not shown) within brush drive housings 153, which also protect brush drive component parts from the corrosive effects of moisture, corrosive chemistries, and the like. Seals 156a, however, create a component of friction in rotating components which is calibrated, compensated, or otherwise compensated in force measurement calculations, and the like. In another embodiment, a labyrinth configuration is used in place of seals 156a.

Figure 10A:
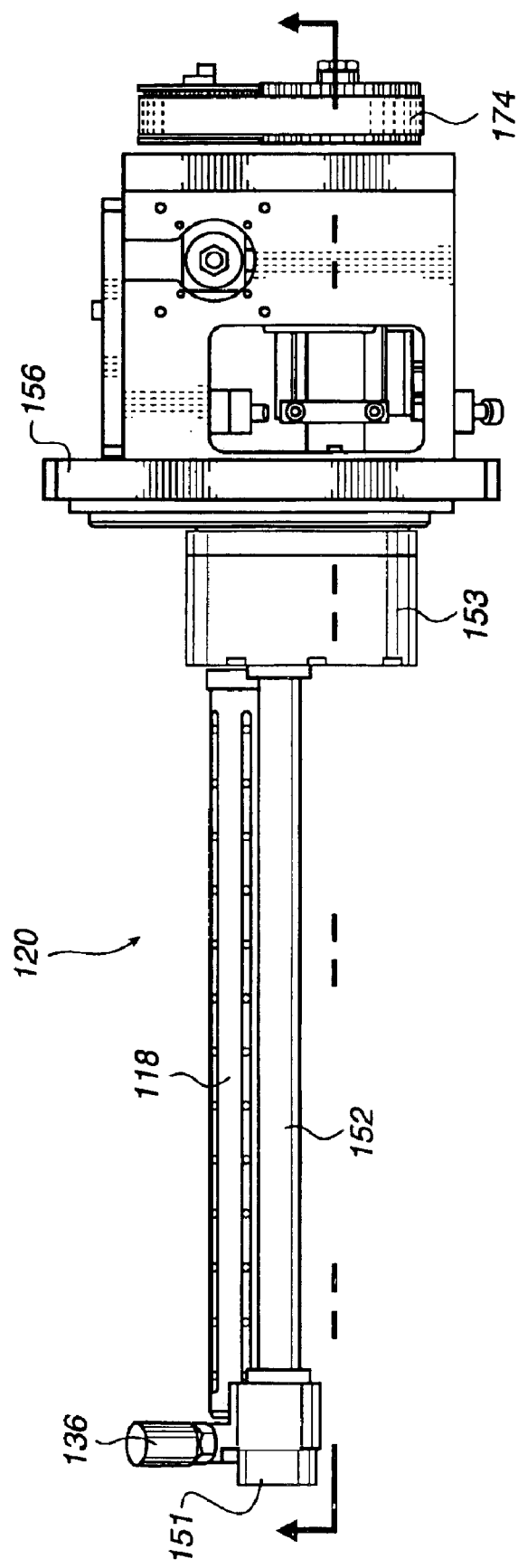
FIG. 10A is a side plan view of a brush drive assembly in accordance with an embodiment of the present invention.

FIG. 10A is a side plan view of a brush drive assembly 120 in accordance with an embodiment of the present invention. Illustrated features include belt 174, and brush front mounting plate 156. Brush drive housing 153 is also identified having a mandrel support arm 152, brush core 118, mandrel support connector 151, and fluid delivery fitting 136.

Figure 10B:
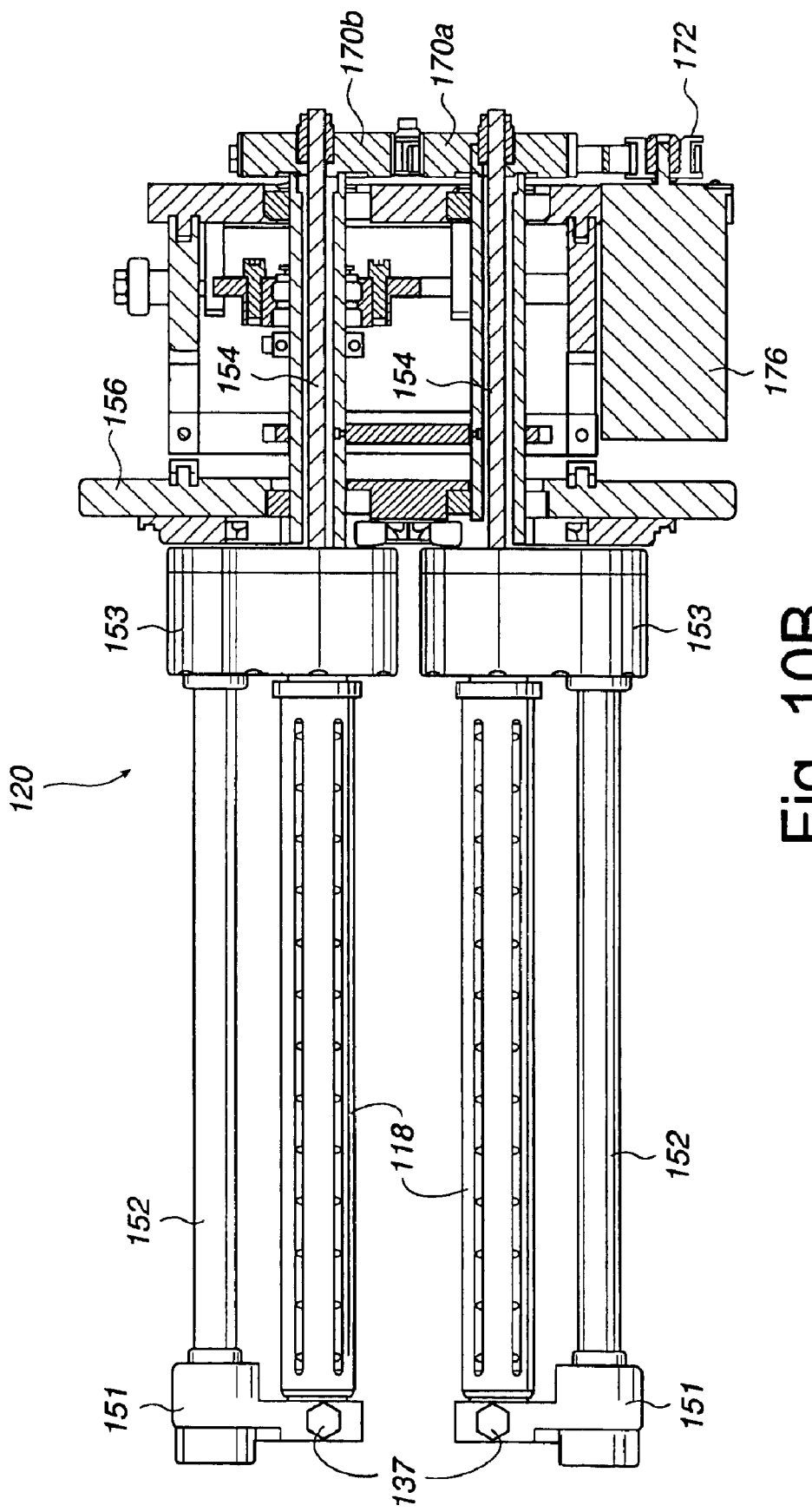
FIG. 10B is a bottom plan view of a brush drive assembly in accordance with an embodiment of the invention.

FIG. 10B is a bottom plan view of a brush drive assembly 120 in accordance with an embodiment of the invention. In FIG. 10B, illustrated features include right brush rotating pulley 170a, left brush rotating pulley 170b, motor 176, and brush rotating drive pulley 172. Brush drive shafts 154, connected to right brush rotating pulley 170a and left brush rotating pulley 170b travel through brush front mounting plate 156 into brush drive housings 153. From each brush drive housing 153, mandrel support arms 152, and brush cores 118 are shown. Each mandrel support arm 152 is connected to a respective brush core 118 with a mandrel support connector 151, having a fluid delivery plug 137.

FIG. 11A shows an exploded view of a single brush drive 150a, 150b, in accordance with an embodiment of the invention. Illustrated features include brush drive shaft 154, and brush drive housing 153. Also shown are mandrel support arm 152, brush core 118, mandrel support connector 151, and fluid delivery fitting 136.

FIG. 11B shows another perspective of exploded brush drive 150a, 150b, in accordance with one embodiment of the present invention. Illustrated features in FIG. 11B include brush drive shaft 154, brush drive housing 153, brush core 118, mandrel support arm 152, mandrel support connector 151, fluid delivery fitting 136 and fluid delivery plug 137. FIG. 11C shows a detail view of the brush drive housing 153 shown in FIG. 11B.

FIG. 12A is a cross-section view of a brush drive 150a, 150b, in accordance with an embodiment of the invention. FIG. 12A shows mandrel 190 within brush drive 150a, 150b. In one embodiment, mandrel 190 is generally a hollow cylinder having a plurality of perforations therein, and a fitting 191 configured to receive fluid plumbing connections. Chemistries, rinses, or any other desired fluids used in substrate processing are dispensed through fitting 191, through the hollow mandrel 190, out of the perforations, and through the brushes on brush cores 118 on to the surfaces of a substrate. Also shown in FIG. 12A are mandrel support arm 152, between mandrel support connector 151 and brush drive housing 153. A brush core 118 is fitted over mandrel 190.

FIG. 12B shows a detail view of the mandrel support connector 151 shown in FIG. 12A. Mandrel support arm 152 connects to mandrel support connector 151 on one side of mandrel support connector 151, and the mandrel 190, having a brush core attached thereto, connects to the mandrel support connector 151 adjacent to the mandrel support arm 152. Fitting 191 is within the mandrel support connector 151, configured to connect to fluid delivery fitting 136 (not shown).

FIG. 12C shows a detail view of the brush drive housing 153 shown in FIG. 12A. Mandrel support arm 152 connects to brush drive housing 153 on one side of brush drive housing 153, and the mandrel 190, having a brush core attached thereto, connects to the brush drive housing 153 adjacent to the mandrel support arm 152. Bearings, seals, and the like are not specifically identified in FIG. 12C, but visible to illustrate an exemplary configuration.

FIG. 13A shows another side plan view of a brush drive assembly 120 in accordance with an embodiment of the present invention. Illustrated features include belt 174, brush drive rear mounting plate 178, and brush front mounting plate 156. Brush drive housing 153 is also identified having a mandrel support arm 152, brush core 118, mandrel support connector 151, and fluid delivery fitting 136.

FIG. 13B is another bottom plan view of a brush drive assembly 120 in accordance with an embodiment of the invention. In FIG. 13B, illustrated features include brush drive housings 153, mandrel support arms 152, and brush cores 118. Each mandrel support arm 152 is connected to a respective brush core 118 with a mandrel support connector 151, having a fluid delivery plug 137.

Figure 13C:
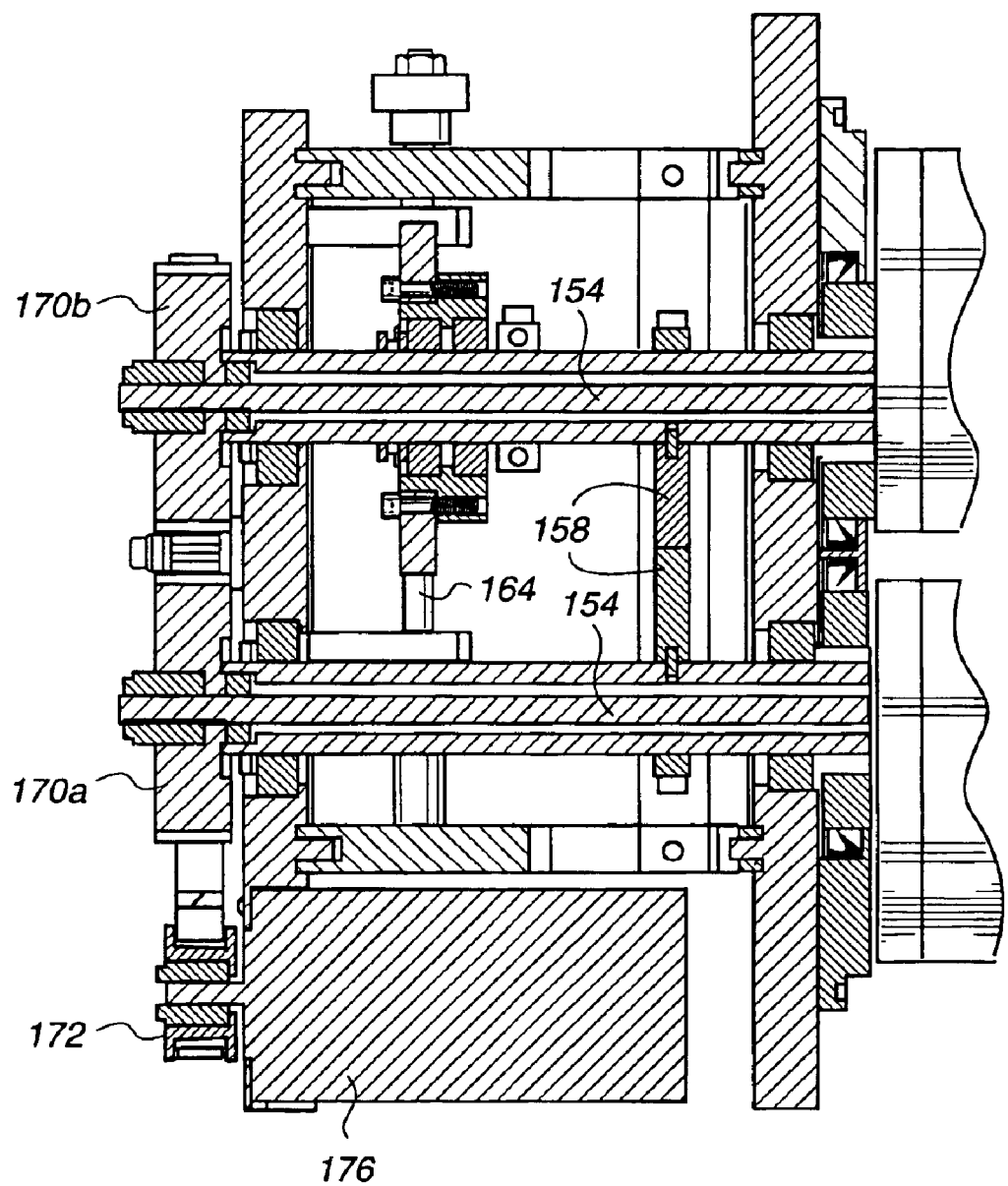
FIG. 13C shows a detail view of the brush drive components from FIG. 13B that are exterior to the brush box.

FIG. 13C shows a detail view of the brush drive components from FIG. 13B that are exterior to the brush box 100 (see FIG. 4). Illustrated features include right brush rotating pulley 170a, left brush rotating pulley 170b, motor 176, and brush rotating drive pulley 172. Brush drive shafts 154, connected to right brush rotating pulley 170a and left brush rotating pulley 170b travel through brush front mounting plate 156 into brush drive housings 153 (not identified in FIG. 13C). Worm shaft 164 and brush angle gears 158 are also identified in FIG. 13C.

Figure 14A:
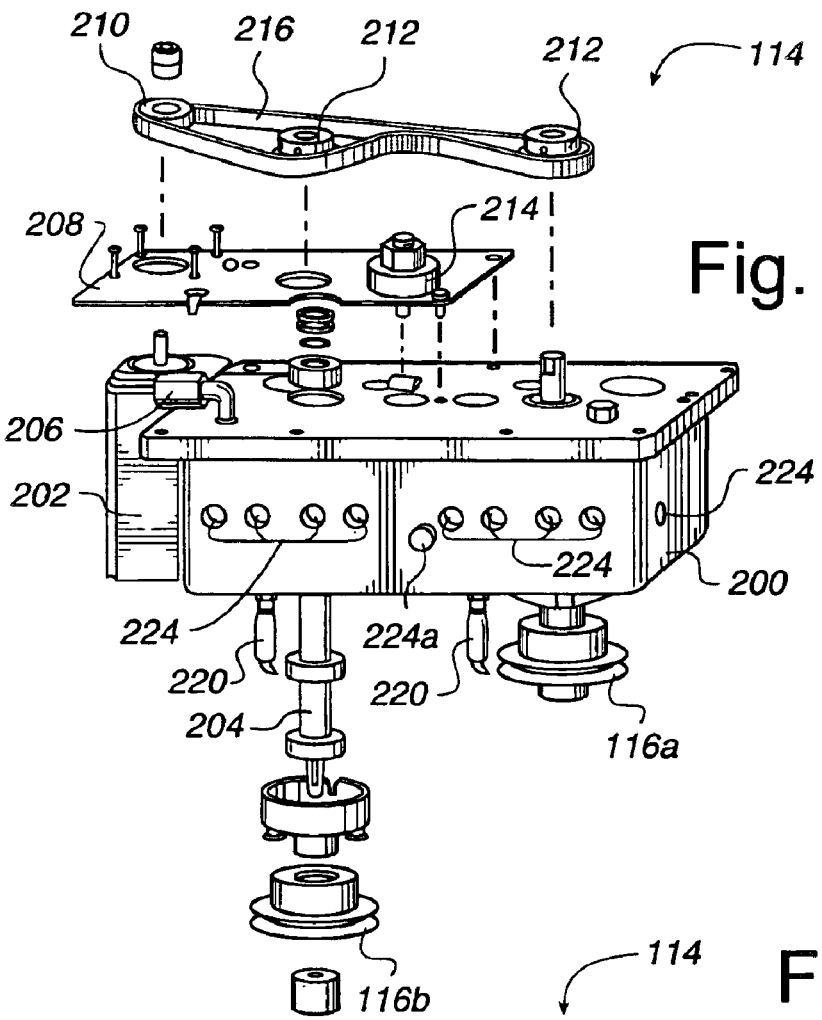
FIG. 14A shows a detailed view of modular edge wheel assembly in accordance with an embodiment of the invention.

FIG. 14A shows a detailed view of modular edge wheel assembly 114 in accordance with an embodiment of the invention. The illustrated edge wheel assembly 114 includes an edge wheel assembly block 200 configured to support and contain the primary features of the edge wheel assembly 114. In one embodiment, the edge wheel assembly block 200 is a solid structure constructed of a corrosive-resistant material such as PEIT, or other light weight, durable, and easily fabricated material, and is manufactured as a single component part for a plurality of implementations as is discussed below.

Figure 14B:
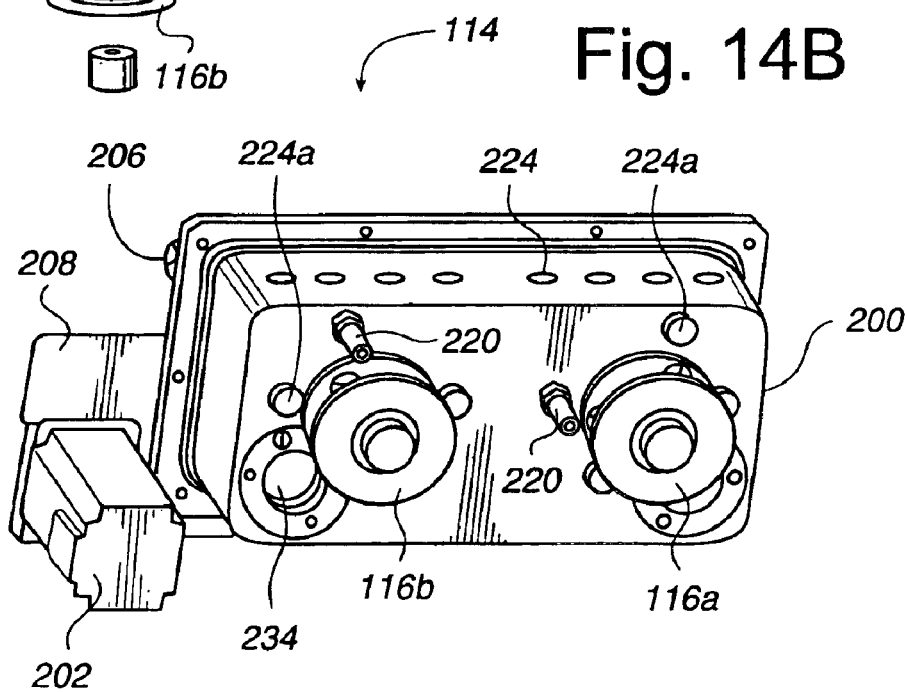
FIG. 14B shows another view of edge wheel assembly in accordance with an embodiment of the invention.
Figure 14C:
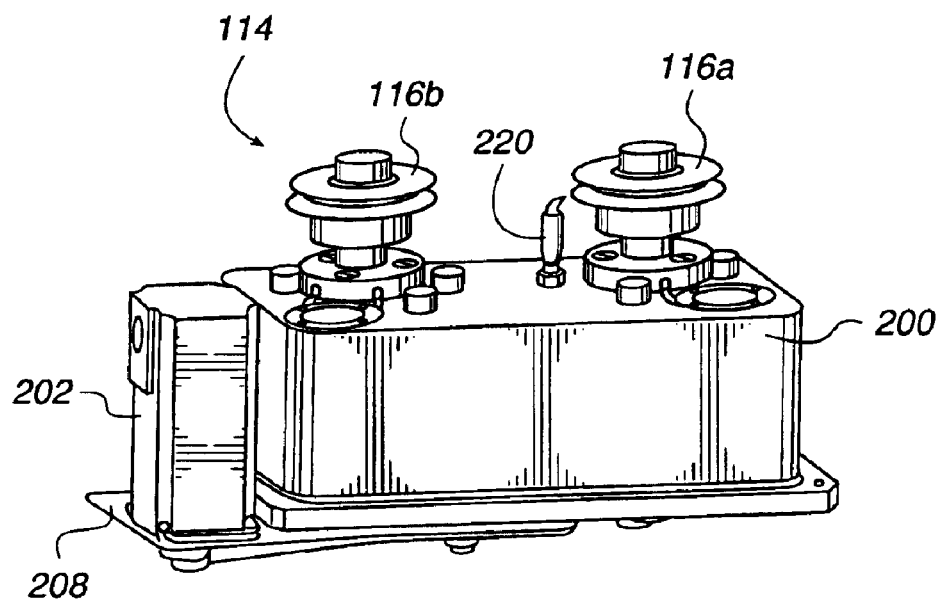
FIG. 14C shows another view of edge wheel assembly in accordance with an embodiment of the invention.
Figure 14D:
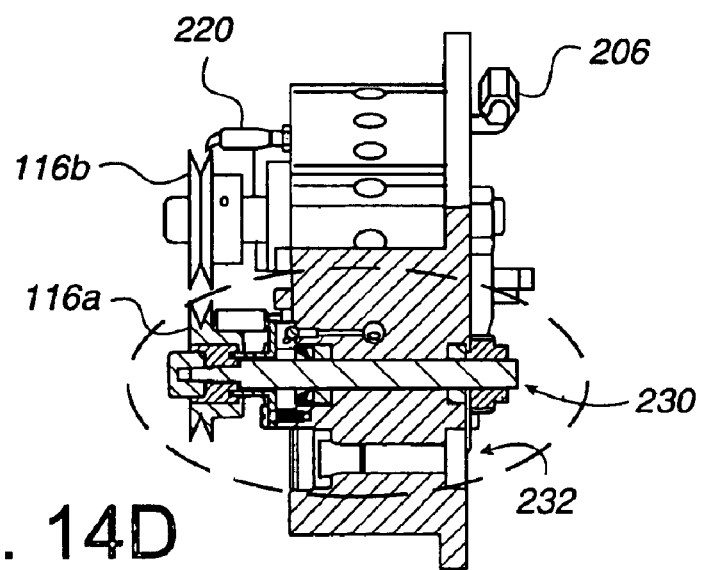
FIG. 14D shows a cross-sectional view of edge wheel assembly in accordance with an embodiment of the invention.
Figure 14E:
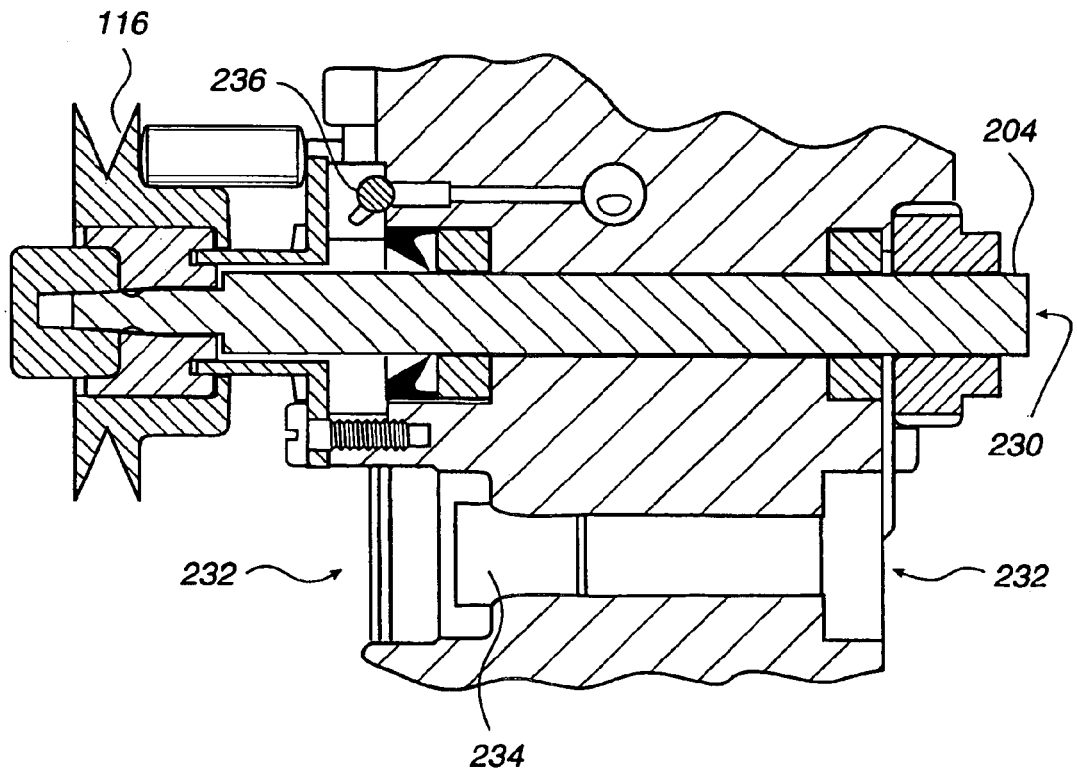
FIG. 14E shows a detail cross-sectional view of shaft bores from FIG. 14D.
Figure 14F:
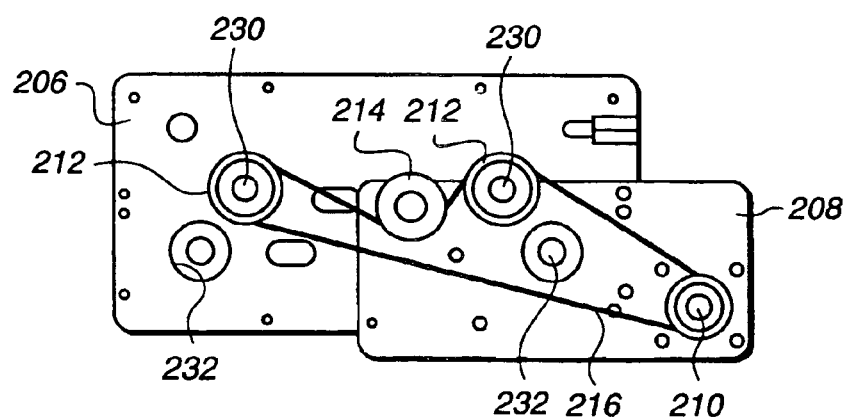
FIG. 14F is a side plan view of edge wheel assembly in accordance with an embodiment of the present invention.

Edge wheels 116a and 116b are attached to edge wheel shafts 204 which are configured through edge wheel assembly block 200 in shaft bores 230 or 232 (see FIGS. 14D, 14E, 14F). In one embodiment, two pairs of shaft bores 230 and 232 are configured into edge wheel assembly block 200 to enable configuration of edge wheel assembly insert 114 for a plurality of substrate sizes. By way of example, edge wheel shafts 204 mounted through shaft bores 230 might position a 200 mm substrate on edge wheels 116a and 116b for optimal processing, and edge wheel shafts 204 mounted through shaft bores 232 might position a 300 mm substrate on edge wheels 116a and 116b for optimal processing. Shaft bores 230 or 232 not used in a desired implementation are plugged with bore plugs 234 (see FIGS. 14B, 14E). As will be described in greater detail, shaft bores 230 and 232 are configured with passages in the interior of edge wheel assembly block 200, and bore plugs 234 seal the passages and bores. In one embodiment of the invention, shaft bores 230 and 232 provide for the easy configuration of the modular edge wheel assembly 114 for optimal processing of both 200 mm substrates and 300 mm substrates. In one embodiment, edge wheels 116a, 116b, are provided of a particular size to be used with a specific size of substrate.

Edge wheels 116a and 116b are rotated by edge wheel shafts 204. Edge wheel shafts 204 are rotated by driven pulleys 212 connected to an edge wheel motor 202. Edge wheel motor 202 is attached to edge wheel motor plate 208 and drives drive pulley 210. Drive pulley 210 is connected to driven pulleys 212 by belt 216 in order to rotate driven pulleys 212 connected to drive shafts 204, thereby rotating edge wheels 116a and 116b. Belt 216 is configured to rotate driven pulleys 212 in the same direction so that edge wheels 116a and 116b rotate a substrate (not shown) positioned thereon. Belt tensioner 214 is provided to maintain constant and appropriate contact between belt 216, drive pulley 210, and driven pulleys 212. In one embodiment, configuration of drive shafts 204 in shaft bores 230 utilizes a larger belt 216 than configuration of edge wheel shafts 204 configured in shaft bores 232. In another embodiment, the process of rotating edge wheel shafts 204 is accomplished by gears.

Edge wheel motor plate 208 is configured to attach edge wheel drive motor 202 to edge wheel assembly block 200. In one embodiment, edge wheel motor plate 208 is reversible, and thereby configurable to attach edge wheel drive motor 202 to edge wheel assembly block 200 in a plurality of implementations of the edge wheel assembly 114. By way of example, edge wheel assembly insert 114 is configurable for implementation in either a right or left panel of brush box 100 (see FIG. 1), and the same edge wheel motor plate 208 is configured to attach edge wheel drive motor 202 to edge wheel assembly block 200 in both configurations.

In one embodiment of the invention, edge wheel assembly block 200 includes a plurality of passages through the interior of the edge wheel assembly block 200 for fluid delivery to a plurality of locations in and on or around edge wheel assembly 114. Edge wheel assembly block fitting 206 is provided to connect fluid supply to the edge wheel assembly 114. In one embodiment, supplied fluid includes DI water, and is provided for rinsing, lubrication, cooling, and the like of the edge of a substrate positioned on edge wheels 116a and 116b. In addition, edge wheels 116a and 116b are rinsed, cooled, lubricated, and the like, as well as edge wheel shafts 204, shaft bores 230 and 232, and interior seals, fittings, bushings, and the like of edge wheel assembly block 200. Sprayers 220 are provided on the edge wheel assembly block 200 in a plurality of locations for desired dispensing of fluids on a substrate edge, edge wheels 116a and 116b, and edge wheel shafts 204. In one embodiment, edge wheel assembly block 200 is configured to accept sprayers 220 in a plurality of locations adjacent to both shaft bores 230 and 232 for sprayer 220 implementation in a plurality of substrate size configurations of edge wheel assembly 114.

In one embodiment, shaft bore sprayer 236 (see FIG. 14E) is provided to dispense fluid to the interior of shaft bores 230 and 232 for cooling and lubrication. Shaft bore sprayers 236 are connected to the interior fluid passages within edge wheel assembly block 200 such that when fluid is supplied to the edge wheel assembly 114, edge wheel shafts 204 are cooled and lubricated with the same fluid used for rinsing, cooling, lubricating, and the like of edge wheels 116a and 116b, and the substrate edge. Shaft bore 230 or 232 that does not have a edge wheel shaft 204 configured in a desired configuration is sealed with bore plug fittings 234 (see FIGS. 14B, 14E).

Interior fluid passages within edge wheel assembly block 200 are configured for a plurality of applications of the edge wheel assembly 114. The interior fluid passages provide for the configuration of sprayers 220 in desired locations, and for the implementation of both shaft bores 230 and 232 to contain shaft bore sprayers 236. In one embodiment, edge wheel assembly block 200 is thereby fabricated as a single component piece to be implemented in a plurality of configurations of edge wheel assembly 114. In one embodiment, edge wheel assembly block 200 is fabricated as a symmetrical component about a mid-point vertical axis. The same assembly block 200 is therefore capable of attaching to a brush box 100 (see FIG. 1) on either a right or left side of brush box 100, and the configured sprayers, fittings, and the like can be configured for either orientation to perform required functions as necessary. The interior fluid passages are configured to provide the desired fluid supply in the plurality of desired applications without requiring specifically and specially manufactured piece parts. In one embodiment, openings 224 in edge wheel assembly block 200 are created during the manufacture of edge wheel assembly block 200, and are fitted with plugs 224a to seal the interior fluid passages.

FIG. 14B shows another view of edge wheel assembly 114 in accordance with an embodiment of the invention. Illustrated features in FIG. 14B include edge wheel assembly block 200 with openings 224 in edge wheel assembly block 200 created during manufacture which can be fitted with plugs 224a. Edge wheel assembly block fitting 206 is provided to connect fluid supply to the edge wheel assembly 114, and sprayers 220 are shown adjacent to edge wheels 116a, 116b. An unused bore is shown sealed by bore plug 234. Edge wheel motor plate 208 is configured to attach edge wheel drive motor 202 to edge wheel assembly block 200. In one embodiment, edge wheel motor plate 208 is reversible, and thereby configurable to attach edge wheel drive motor 202 to edge wheel assembly block.200 in a plurality of implementations of the edge wheel assembly 114.

FIG. 14C shows another view of edge wheel assembly 114 in accordance with an embodiment of the invention. Identified features in FIG. 14C include edge wheel assembly block 200, sprayer 220, and edge wheels 116a, 116b. Edge wheel motor plate 208 is shown attaching edge wheel drive motor 202 to edge wheel assembly block 200.

FIG. 14D shows a cross-sectional view of edge wheel assembly 114 in accordance with an embodiment of the invention. Features identified in FIG. 14D include edge wheels 116a, 116b, sprayer 220, and edge wheel assembly block fitting 206. Shaft bores 230 and 232 are identified, and described in greater detail below.

FIG. 14E shows a detail cross-sectional view of shaft bores 230, 232 from FIG. 14D. In FIG. 14E, side-by-side shaft bores 230 and 232 are shown with an edge wheel shaft 204 and edge wheel 116 configured in shaft bore 230, and a bore plug 234 configured in unused shaft bore 232. Shaft bore sprayer 236 is shown adjacent to edge wheel shaft 204 in shaft bore 230. In one embodiment, shaft bore sprayer 236 provides cooling, lubrication, and the like to edge wheel shaft 204 and shaft bore 230, and additionally keeps shaft seals, bearings, bushings, (not identified in FIG. 14E, but visible) and the like lubricated, pliable, and properly functioning.

FIG. 14F is a side plan view of edge wheel assembly 114 in accordance with an embodiment of the present invention. Identified features in FIG. 14F include edge wheel assembly block 200 having shaft bores 230 and 232. Driven pulleys 212, and drive pulley 210 are interconnected by belt 216, with belt tensioner 214 provided to maintain constant and appropriate contact between belt 216, drive pulley 210, and driven pulleys 212. In an embodiment with drive shafts 204 (not shown) in shaft bores 232, a different size of belt 216 may be provided than that in the illustrated embodiment. Edge wheel motor plate 208 is configured to attach edge wheel drive motor 202 (not visible in FIG. 14F) to edge wheel assembly block 200.

Figure 15A:
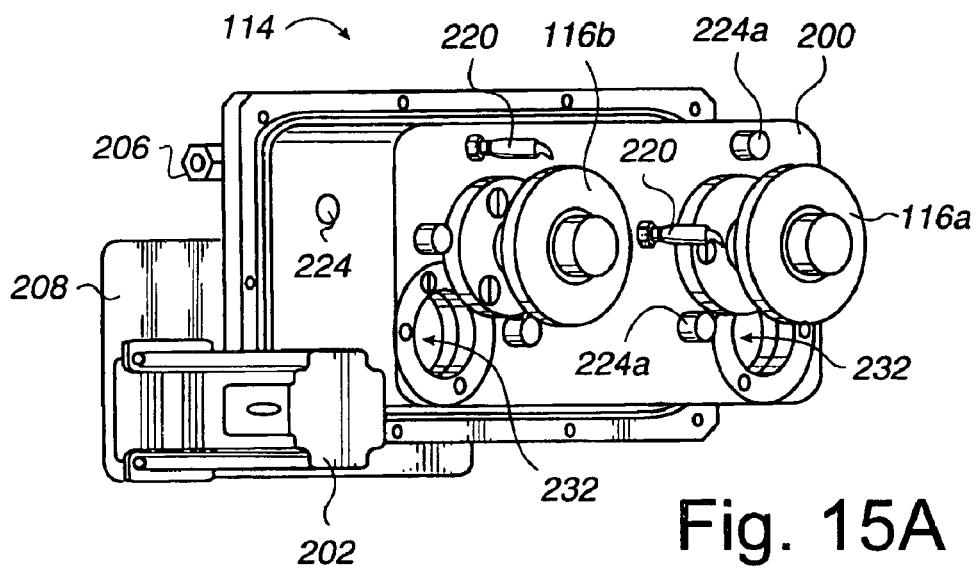
FIG. 15A shows another perspective view of edge wheel assembly in accordance with an embodiment of the invention.

FIG. 15A shows another perspective view of edge wheel assembly 114 in accordance with an embodiment of the invention. In FIG. 15A, identified features include edge wheel assembly block 200 with openings 224 and plugs 224a, and sprayers 220. Edge wheels 116a, 116b are configured in one set of shaft bores, and unused shaft bores 232 are visible. Edge wheel drive motor 202 is attached to edge wheel assembly block 200 with edge wheel motor plate 208. Fluids, chemistries, and the like are provided to edge wheel assembly block 200 through edge wheel assembly block fitting 206.

Figure 15B:
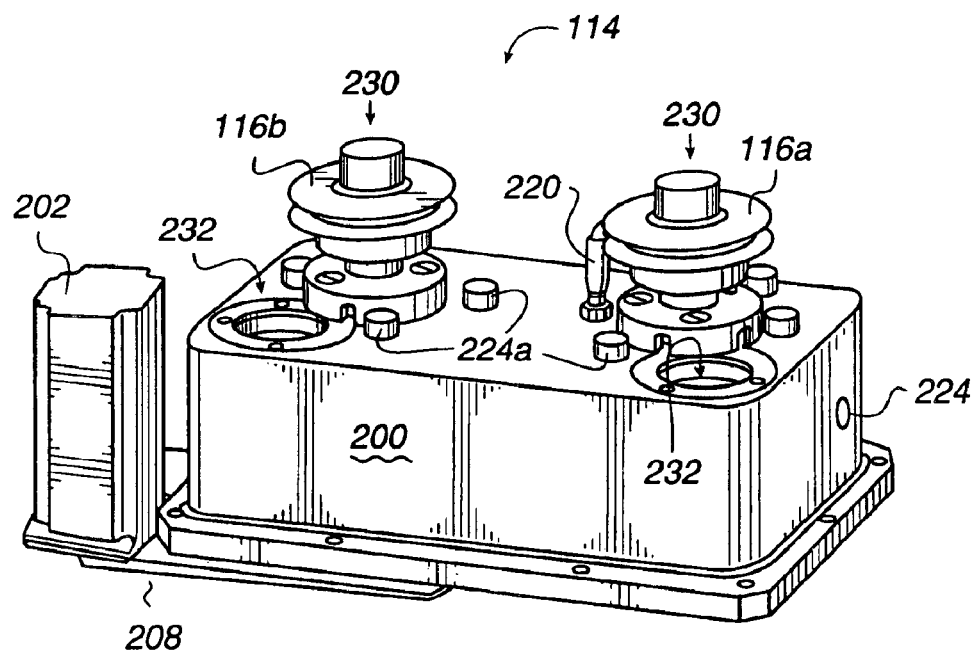
FIG. 15B shows another perspective view of edge wheel assembly in accordance with another embodiment of the present invention.

FIG. 15B shows another perspective view of edge wheel assembly 114 in accordance with another embodiment of the present invention. Identified features in FIG. 15B include edge wheel assembly block 200 with openings 224 and plugs 224a, and sprayers 220. Edge wheels 116a, 116b are configured in shaft bores 230, and unused shaft bores 232 are visible. Edge wheel drive motor 202 is attached to edge wheel assembly block 200 with edge wheel motor plate 208.

Figure 15C:
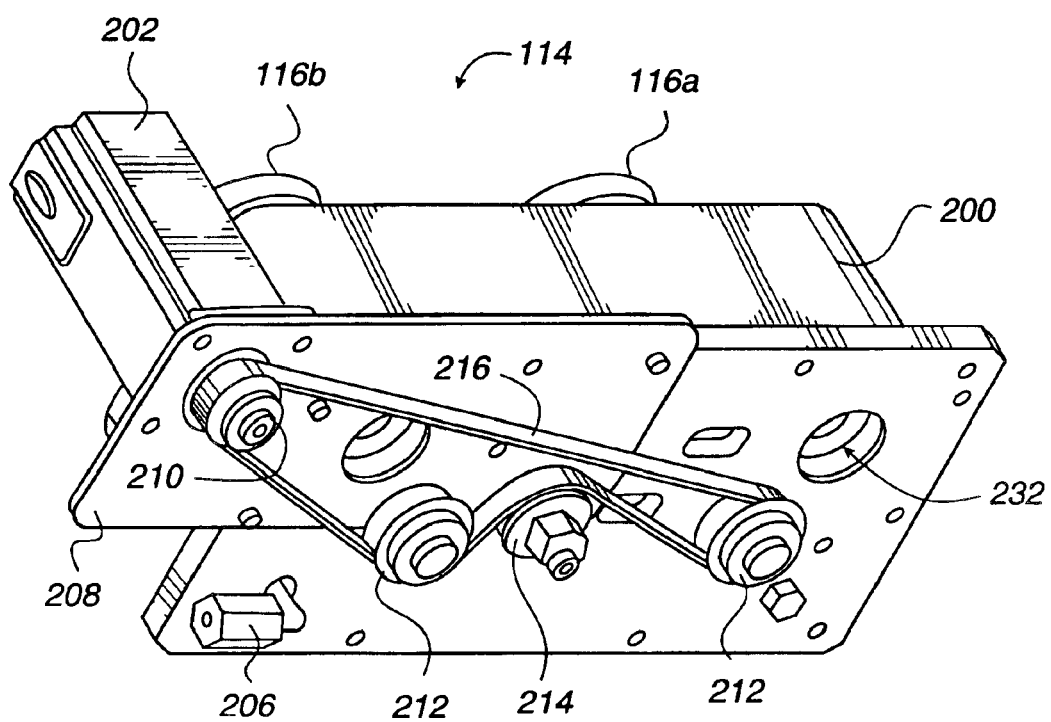
FIG. 15C shows another perspective view of edge wheel assembly in accordance with another embodiment of the invention.

FIG. 15C shows another perspective view of edge wheel assembly 114 in accordance with another embodiment of the invention. Identified features in FIG. 15C driven pulleys 212, and drive pulley 210 interconnected by belt 216, with belt tensioner 214 provided to maintain constant and appropriate contact between belt 216, drive pulley 210, and driven pulleys 212. Edge wheels 116a, 116b are configured in shaft bores 230 (not identified in FIG. 15C), and unused shaft bores 232 are visible. Edge wheel drive motor 202 is attached to edge wheel assembly block 200 with edge wheel motor plate 208. Fluids, chemistries, and the like are provided to edge wheel assembly block 200 through edge wheel assembly block fitting 206.

In one embodiment of the present invention, substantially all pieces, components, and assembly parts of the brush box 100 that may be exposed to processing fluids are constructed of durable, light weight, and easily manufactured, molded, and configured material that is resistant to corrosion or other deterioration that might result from exposure to a plurality of processing fluids. Materials for such wet exposure include plastic, PET, or other similar materials. Supporting, structural, and other such component parts of the brush box 100 that are generally not exposed to processing fluids are manufactured of strong, light weight, and low particle generating materials such as hastelloy and stainless steel.

As described, one embodiment of the brush box 100 is easily configurable for a plurality of applications. Primary components are generally modular and symmetrical to provide for more efficient manufacture of components that are implemented in a plurality of configurations. In a typical implementation, brush box 100 is implemented as a pair of side-by-side brush boxes 100, with a left and right brush box 100. Left and right brush boxes 100 are typically of a symmetrical configuration with maximum access for use and serviceability. In one embodiment, such a configuration includes the edge wheel insert assemblies 114 configured to the exterior panels of brush box 100, and doors 110 hinged to open towards the center of the configuration. The present invention provides for the configuration of a plurality of desired implementations without requiring specialized or specific manufacture of the various component parts. In this manner, cost of manufacture is significantly reduced, and serviceability is significantly increased.

Figure 16B:
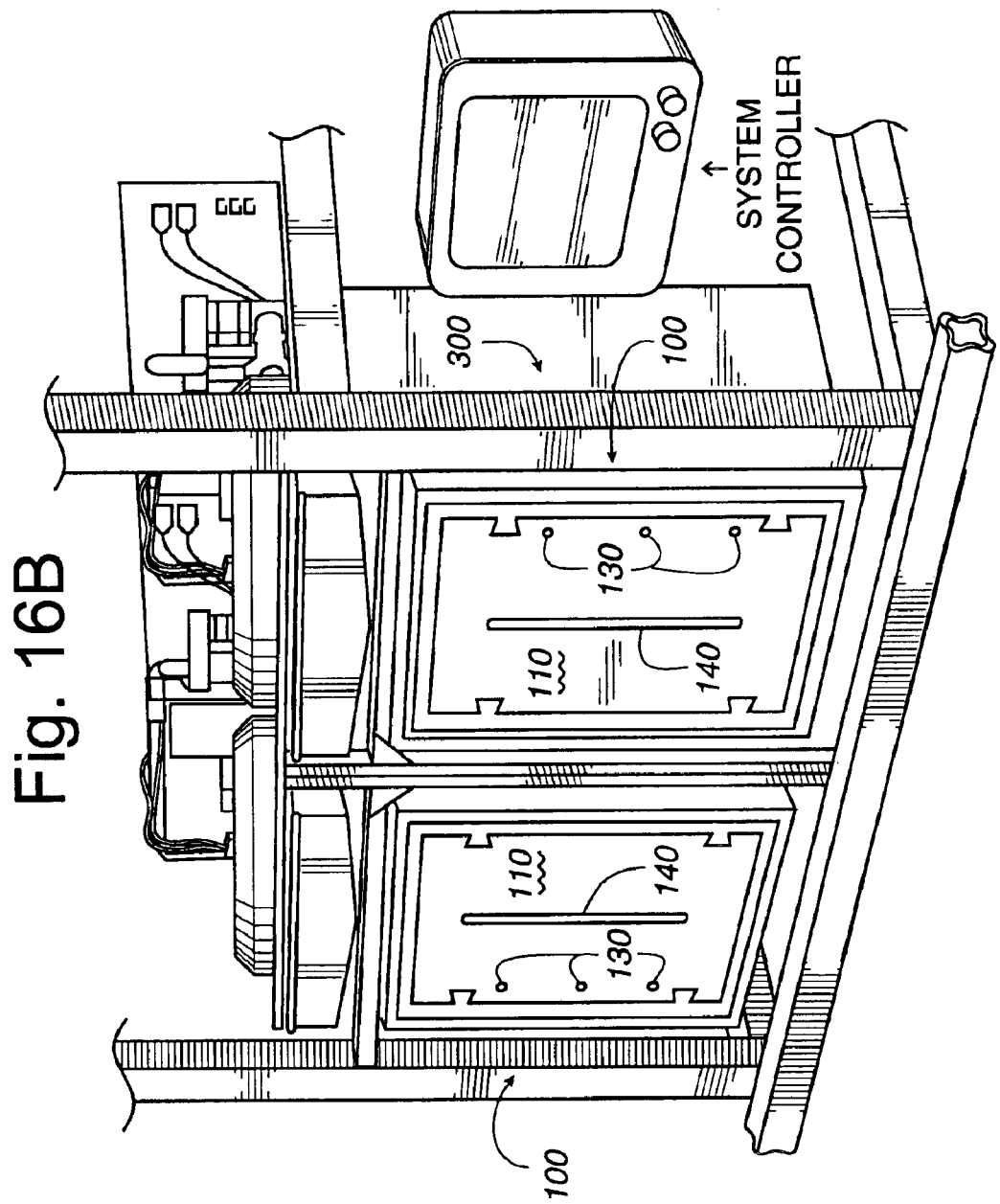
FIG. 16B shows the same integrated processing tool as in FIG. 16A from a different angle.

FIGS. 16A and 16B show an integrated processing tool incorporating a pair of brush boxes 100 in accordance with an embodiment of the invention. In FIG. 16A, a pair of brush boxes 100 is configured side-by-side, and a pair of drying tools is configured above the brush boxes 100. Implementing a pair of brush boxes 100 with a pair of drying tools provides an efficient and economical method of substrate processing at a plurality of substrate process steps. By way of example, batches of semiconductor wafers can be processed through a post-CMP wet clean with minimal transfer and handling of the wafers when the integrated processing tool is positioned proximate to the CMP tool.

FIG. 16B shows the same integrated processing tool as in FIG. 16A from a different angle. As can be seen, one embodiment of the invention implementing a side-by-side configuration maximizes serviceability and space efficiency. Brush boxes 100 are configured with such assemblies as the wafer sensing apparatus, the substrate stabilizer assembly, and the edge wheel assembly on the exterior or outboard panel 300 of each brush box 100. Doors 110 are configured to open toward the interior or inboard region of the tool with securing screws 130 shown on the exterior or outboard edge of doors 110. A system controller is shown and is used to integrate the plurality of functions of the present invention, as well as the present invention with the additional processing tools.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. In a brush box for processing a substrate, a modular edge wheel assembly, comprising:

an edge wheel assembly blocks, the edge wheel assembly block including passages through which fluids can flow for cooling and lubrication of the substrate and the modular edge wheel assembly;

a pair of edge wheels, each edge wheel being connected to an edge wheel shaft at a processing end, each edge wheel shaft projecting through the edge wheel assembly block through an edge wheel shaft bore; and an edge wheel drive motor configured to drive edge wheel drive pulleys connected to a drive end of each edge wheel shaft, wherein the modular edge wheel assembly is configurable to be interchangeably attached as a unit to one of a right side and a left side of the brush box.

2. The modular edge wheel assembly of claim 1, wherein the pair of edge wheels are configured to receive and support a substrate to be processed in the brush box, the substrate being positioned in a vertical orientation within the brush box.

3. The modular edge wheel assembly of claim 2, wherein when the edge wheel drive motor drives the edge wheel drive pulleys, the edge wheels are caused to rotate, and the substrate supported on the edge wheels is thereby caused to rotate.

4. The modular edge wheel assembly of claim 1, further comprising an edge wheel motor plate configured to couple the edge wheel drive motor to the edge wheel assembly block.

5. The modular edge wheel assembly of claim 4, wherein the edge wheel motor plate is capable of being coupled to the edge wheel assembly block in one of two locations, one location for when the modular edge wheel assembly is attached to the right side of the brush box and one location for when the modular edge wheel assembly is attached to the left side of the brush box.

6. The modular edge wheel assembly of claim 1, further comprising sprayers attached to the edge wheel assembly block and configured to spray fluid on each of the pair of edge wheels.

7. The modular edge wheel assembly of claim 1, wherein the modular edge wheel assembly is configurable for processing a plurality of substrate sizes.

8. An edge wheel assembly for supporting a vertically oriented substrate, the edge wheel assembly designed to be inserted into side walls of a brush box, the edge wheel assembly comprising:

an edge wheel assembly block, the edge wheel assembly block being capable of interchangeably mounting to either of two side walls of the brush box;

a plurality of passages through the edge wheel assembly block, the plurality of passages configured to provide fluid flow through the edge wheel assembly block;

a first edge wheel and a second edge wheel being mounted to the edge wheel assembly block, each of the first and second edge wheels having a groove that is capable of supporting the substrate, the first and second edge wheels further being aligned with one another to enable rotation of the supported substrate; and a drive motor being coupled to a plate, the plate being designed to couple to the edge wheel assembly block, the plate being coupled to either one of a first side and a second side of the edge wheel assembly block, the first side and the second side being external to the brush box.

9. The edge wheel assembly of claim 8, wherein the edge wheel assembly block includes at least two pairs of shaft bores.

10. The edge wheel assembly of claim 9, wherein each of the at least two pairs of shaft bores is defined for the substrate having a particular diameter.

11. The edge wheel assembly of claim 8, wherein the fluid flow is configured to lubricate and to cool each of the at least two pairs of shaft bores.

12. The edge wheel assembly of claim 8, wherein the fluid flow is configured to lubricate and to cool an edge of the substrate.

13. The edge wheel assembly of claim 8, wherein the drive motor causes rotation of the first edge wheel and the second edge wheel with a drive belt assembly.

14. The edge wheel assembly of claim 8, wherein the drive motor caused rotation of the first edge wheel and the second edge wheel with a gear assembly.

15. An edge wheel assembly in a semiconductor wafer fabrication brush box, the edge wheel assembly configured to support and to rotate a semiconductor wafer in a vertical orientation within the brush box, the edge wheel assembly comprising:

an edge wheel assembly block having at least two pairs of edge wheel shaft bores through the edge wheel assembly block;

a first edge wheel attached to a processing end of a first edge wheel shaft and a second edge wheel attached to a processing end of a second edge wheel shaft, the first edge wheel shaft and the second edge wheel shaft extending through the edge wheel assembly block in one of the at least two pairs of edge wheel shaft bores; and a drive motor being coupled to the edge wheel assembly block with a plate, the plate being designed to couple drive motor to either one of a first position and a second position on the edge wheel assembly block, the first position and the second position being external to the brush box and enabling insertion of the edge wheel assembly into either one of a first side and a second side of the brush box, wherein the edge wheel assembly block is formed with a plurality of passages through the edge wheel assembly block, the plurality of passages being symmetrical about a horizontal and a vertical center line of the edge wheel assembly block and configured to enable fluid flow through the edge wheel assembly block.

16. The edge wheel assembly of claim 15, further comprising:

a first drive pulley connected to a drive end of the first edge wheel shaft;

a second drive pulley connected to a drive end of the second edge wheel shaft; and a drive belt configured to interconnect the drive motor to the first and second drive pulleys, wherein the drive motor rotates the first and the second drive pulleys causing rotation of the first and second edge wheels.

17. The edge wheel assembly of claim 15, wherein the semiconductor wafer is one of a 200 mm wafer and a 300 mm wafer.

* * * * *